United States Patent [19]
Fukada et al.

[11] Patent Number: 5,525,549
[45] Date of Patent: Jun. 11, 1996

[54] METHOD FOR PRODUCING AN ACCELERATION SENSOR

[75] Inventors: Tsuyoshi Fukada, Aichi-gun; Yoshimi Yoshino, Inuyama; Yukihiko Tanizawa, Chiryu, all of Japan

[73] Assignee: Nippondenso Co., Ltd., Kariya, Japan

[21] Appl. No.: 49,801

[22] Filed: Apr. 21, 1993

[30] Foreign Application Priority Data

| Apr. 22, 1992 | [JP] | Japan | 4-103091 |
| May 27, 1992 | [JP] | Japan | 4-135361 |
| Jun. 17, 1992 | [JP] | Japan | 4-158331 |
| Jun. 19, 1992 | [JP] | Japan | 4-161235 |
| Sep. 18, 1992 | [JP] | Japan | 4-250162 |
| Sep. 18, 1992 | [JP] | Japan | 4-250163 |

[51] Int. Cl.$^6$ .................. H01L 21/3063; H01L 21/78; H01L 21/64
[52] U.S. Cl. .................. 437/227; 437/228; 437/901; 437/921; 148/DIG. 28; 148/DIG. 159; 156/627.1; 156/657.1; 216/86; 73/777
[58] Field of Search .................. 156/627.1, 657.1; 437/226, 227, 228, 901, 921; 148/DIG. 28, DIG. 152; 73/718, 721, 724, 727, 777; 216/86

[56] References Cited

U.S. PATENT DOCUMENTS 5,071,510 12/1991 Findler et al. .................. 156/627.1

(List continued on next page.)

FOREIGN PATENT DOCUMENTS

| 59-13377 | 1/1984 | Japan . | |
| 61-30039 | 2/1986 | Japan . | |
| 61-30038 | 2/1986 | Japan | 437/901 |
| 61-97572 | 5/1986 | Japan . | |
| 63-292071 | 11/1988 | Japan . | |
| 2-132843 | 5/1990 | Japan | 437/901 |

OTHER PUBLICATIONS

Translation of JP 61-30039 (Hirata), Provided by the Applicant on PTO 1449.
S. K. Ghandhi, "VLSI Fabrication Principles" 1st ed., 1983, Wiley, pp. 617–619.
K. E. Petersen, Proceedings of the IEEE, 70, 5 (1982) 443 "Silicon as a Mechanical Material".
H. A. Waggener, "Electrochemically Controlled Thinning of Silicon", Bell System Technical Journal, vol. 50, 1970 pp. 473–475.
T. N. Jackson et al., "An Electrochemical P–N Junction Etch-Stop for the Formation of Silicon Microstructures", IEEE Electron Device Letter, Vo. EDL-2 No. 2, Feb. 1981, pp. 44–45.

*Primary Examiner*—Tom Thomas
*Assistant Examiner*—Leon Radomsky
*Attorney, Agent, or Firm*—Cushman, Darby & Cushman

[57] ABSTRACT

A method for producing a semiconductor device that is capable of solving problems related to dicing a metal thin film used for electrochemical etching. According to the method, an n type epitaxial thin layer is formed on a p type single-crystal silicon wafer. An n$^+$ type diffusion layer is formed in a scribe line area on the epitaxial layer. An n$^+$ type diffusion layer is formed in an area of the epitaxial layer which corresponds to a predetermined portion of the wafer. An aluminum film is formed over the diffusion layers. The aluminum film has a clearance for passing a dicing blade. Portions of the wafer are electrochemically etched by supplying electricity through the aluminum film and the diffusion layers, to leave portions of the epitaxial layer. The wafer is diced into chips along the scribe line area. Each of the chips forms a separate semiconductor device. The electrochemical etching of the wafer is carried out after the formation of the aluminum film by immersing the wafer in a KOH aqueous solution and by supplying electricity through the aluminum film. The electrochemical etching is terminated at an inflection point where an etching current inflects to a constant level from a peak level. During the electrochemical etching, the diffusion layer reduces horizontal resistance in the epitaxial layer, so that the etched parts receive a sufficient potential to perform the etching.

13 Claims, 49 Drawing Sheets

U.S. PATENT DOCUMENTS

| | | |
|---|---|---|
| 5,095,349 | 3/1992 | Fujii et al. |
| 5,172,207 | 12/1992 | Nojiri et al. ............................. 437/921 |
| 5,173,149 | 12/1992 | Nojiri et al. ......................... 156/627.1 |
| 5,202,281 | 4/1993 | Ishibashi ................................. 437/228 |
| 5,289,721 | 3/1994 | Tanizawa et al. ........................ 73/727 |
| 5,324,688 | 6/1994 | Kondo ..................................... 437/901 |
| 5,408,112 | 4/1995 | Tai et al. ................................. 257/254 |

METHOD FOR PRODUCING AN ACCELERATION SENSOR

BACKGROUND OF THE INVENTION

1. Field of the Invention

The present invention relates to a method for producing a semiconductor device such as a semiconductor acceleration sensor.

2. Description of the Related Art

Japanese Unexamined Patent Publication No. 59-13377 discloses an electrochemical etching method for processing a diaphragm of a diaphragm silicon pressure sensor. This method employs an HF-based etching liquid. The etching liquid etches a silicon wafer when a voltage is applied with no flow of current. The etching is stopped if a flow of current is detected.

A KOH-based etching liquid is also employable. When a voltage is applied with no flow of current, the etching liquid etches a silicon wafer due to chemical reactions between KOH and silicon. Since the KOH-based etching liquid causes anodic oxidation of silicon to continuously produce a weak flow of current, it is difficult to clearly detect the end of the etching.

The electrochemical etching is useful to precisely form a thin part such as a diaphragm of semiconductor pressure sensors and acceleration sensors. Conventional electrochemical etching methods usually employ scribe lines as current supply paths to etch a wafer. Japanese Unexamined Patent Publication No. 61-30039 employs an n type high concentration diffusion layer to supply an etching current. To improve the efficiency of etching, a metal thin film having lower resistance may be employed instead of the diffusion layer. The metal thin film formed on scribe lines on a wafer, however, produces metal dust when a dicing blade dices the wafer into chips along the scribe lines. The metal dust will adhere to the chips to damage the properties thereof.

The Japanese Unexamined Patent Publication No. 61-30039 employs a silicon substrate made of upper and lower conductive layers having different conduction types. A high concentration diffusion layer serving as an electrode is formed on the substrate. The lower layer is electrochemically etched so that the upper layer is left to form a diaphragm.

This technique is effective to provide each chip with a diaphragm of uniform thickness when the chip is small. When the chip is large, however, the technique hardly achieves uniform thickness in the diaphragm. It is particularly difficult to form a diaphragm of uniform thickness when a thin epitaxial layer is employed to fabricate a thin diaphragm. This is because such a thin epitaxial layer has a higher horizontal resistance, and therefore, a central part of each chip area distal from scribe lines receives insufficient potential from a voltage supply source. Because of this, etching will not easily stop at the central part because an anodic oxidation film is hardly formed there.

The conventional methods have the problems of incorrectly detecting the end of etching, of erroneously stopping the etching and of scattering a metal film formed on scribe lines when a wafer is cut into chips along the scribe lines. Such scattered metal film will make semiconductor circuits on each chip defective, thus deterrorating the yield. The conventional methods are unable to form a diaphragm of uniform thickness from a thin epitaxial layer due to a high horizontal resistance of the layer.

SUMMARY OF THE INVENTION

A first object of the present invention is to provide a method for producing a semiconductor device, capable of terminating electrochemical etching at an optimum time.

A second object of the present invention is to provide a method for producing a semiconductor device capable of solving the problem of metal dust from a metal thin film that is used for electrochemically etching a wafer and which is cut when the wafer is diced into chips after etching.

A third object of the present invention is to provide a method for producing a semiconductor device capable of reducing horizontal resistance in a wafer to be electrochemically etched.

In order to accomplish these objects, a method for producing a semiconductor device according to a basic aspect of the present invention employs a first step of forming a single-crystal semiconductor thin film of a second conduction type over a single-crystal semiconductor substrate of a first conduction type. A second step of forms a conductive material in a scribe line area on the thin film. A third step electrochemically etches the substrate with the conductive material transmitting etching electricity to remove predetermined parts of the substrate and a fourth step of dices the substrate into chips along the scribe line area, each of the chips forming the semiconductor device.

A first aspect of the present invention provides a method for producing a semiconductor device, employing a first step of forming a single-crystal semiconductor thin film of a second conduction type over a single-crystal semiconductor substrate of a first conduction type. A second step forms a metal thin film in a scribe line area on the semiconductor thin film, the metal thin film having a clearance for passing a dicing blade. A third step electrochemically etches the substrate with the metal thin film transmitting etching electricity to remove predetermined parts of the substrate and leave predetermined parts of the semiconductor thin film, and a fourth step of dices the substrate into chips along the scribe line area, each of the chips forming the semiconductor device.

A second aspect of the present invention provides a method for producing a semiconductor device, employing a first step of forming a single-crystal semiconductor thin film of a second conduction type over a single-crystal semiconductor substrate of a first conduction type. A second step forms a conductive material in a scribe line area on the thin film. A third step immerses the substrate in a KOH-based etching liquid, electrochemically etches the substrate with the conductive material transmitting etching electricity, and stops the electrochemical etching at an inflection point where an etching current inflects to a constant level from a peak level, thereby removing predetermined parts of the substrate and leaving predetermined parts of the thin film. A fourth step dices the substrate into chips along the scribe line area, each of the chips forming the semiconductor device.

A third aspect of the present invention provides a method for producing a semiconductor device, employing a first step of a forming an epitaxial layer of second conduction type over a single-crystal semiconductor substrate of a first conduction type. A second step forms a high concentration diffusion layer of the second conduction type in a scribe line area on the epitaxial layer as well as a high concentration diffusion layer of second conduction type in a predetermined area within each chip area on the epitaxial layer. A third step electrochemically etches predetermined parts of the substrate with the diffusion layer in the scribe line area serving as an electrode, to leave predetermined parts of the epitaxial layer, and a fourth step dices the substrate into chips along the scribe line area, each of the chips forming the semiconductor device.

A fourth aspect of the present invention provides a method for producing a semiconductor device, employing a first step of forming a high concentration diffusion layer of a second conduction type over a single-crystal semiconductor substrate of a first conduction type and then an epitaxial layer of the second conduction type over the diffusion layer. A second step of forms a high concentration diffusion layer of the second conduction type in a scribe line area on the epitaxial layer. A third step electrochemically etches predetermined parts of the substrate with the diffusion layer in the scribe line area serving as an electrode, to leave predetermined parts of the epitaxial layer; and a fourth step of dicing the substrate into chips along the scribe line area, each of the chips forming the semiconductor device.

DESCRIPTION OF THE PREFERRED EMBODIMENTS

Methods for producing a semiconductor device according to the present invention will be explained with reference to figures.

The structure of a semiconductor acceleration sensor produced according to the present invention will be explained first.

Figure 1:
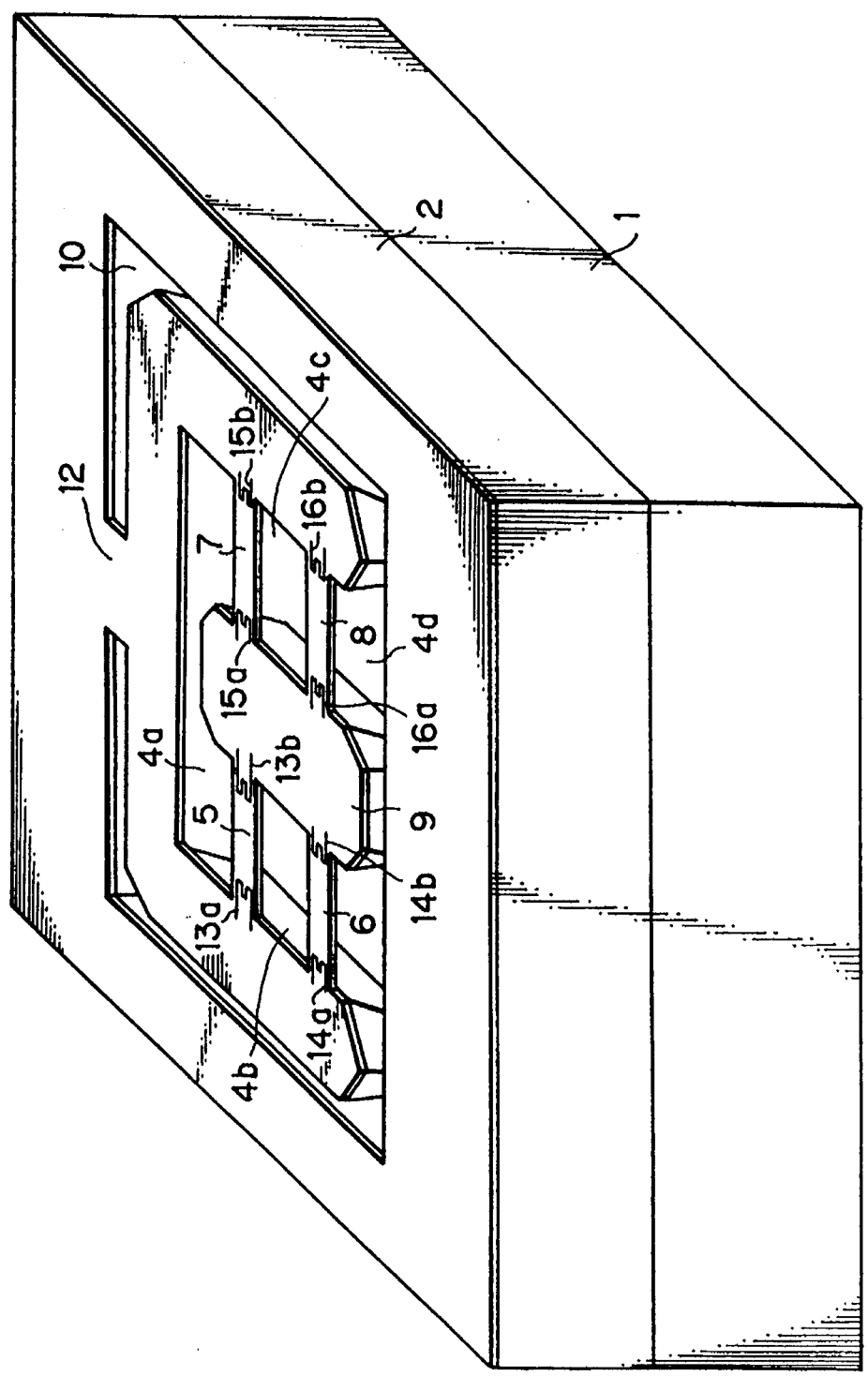
FIG. 1 is a perspective view showing a semiconductor acceleration sensor fabricated according to the present invention.
Figure 2:
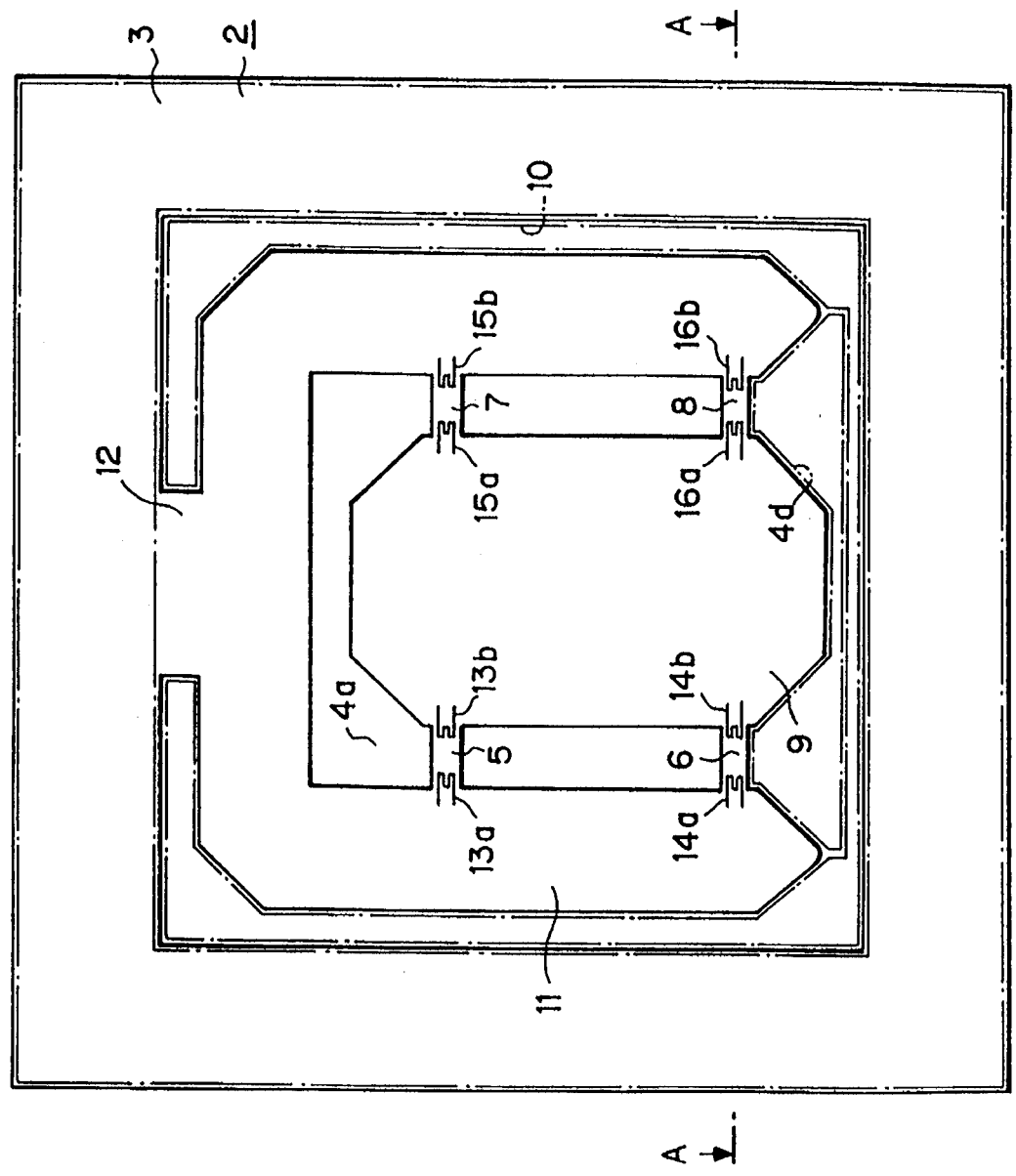
FIG. 2 is a plan view showing the sensor.
Figure 3:
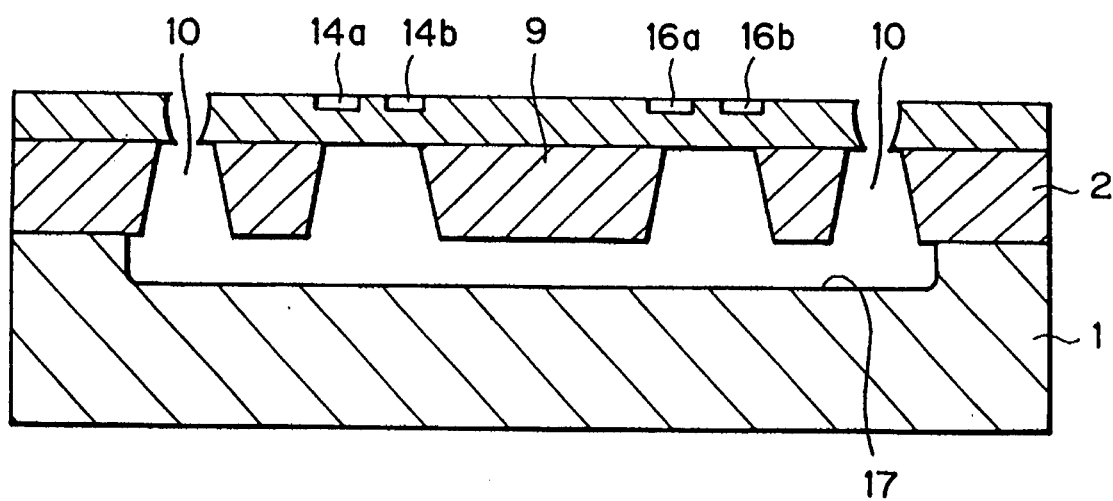
FIG. 3 is a sectional view taken along a line A—A of FIG. 2.

FIG. 1 is a perspective view showing the semiconductor acceleration sensor. FIG. 2 is a plan view showing the sensor. FIG. 3 is a sectional view taken along a line A—A of FIG. 2. This sensor may be employed for an ABS system of a car.

The sensor has a square base 1 made of Pyrex glass and a square silicon chip 2 attached to the top of the base 1. The chip 2 has a first square support 3 whose bottom is attached to the base 1. The support 3 forms four sides of the chip 2. At the central part of the chip 2, four through holes 4a, 4b, 4c, and 4d are formed to define four movable thin beams 5, 6, 7, and 8 and a thick rectangular weight 9. A through hole 10 is formed along the inner side of the first support 3, to define a thick channel-shaped second support 11 and a thick joint 12. Namely, the first and second supports 3 and 11 with the through hole 10 interposing between them are connected to each other through the joint 12. The weight 9 and second support 11 with the through holes 4a to 4d interposing between them are connected to each other through the movable thin beams 5 to 8.

The thickness of each of the beams 5 to 8 is about 5 micrometers. Pairs of piezoresistance layers 13a and 13b, 14a and 14b, 15a and 15b, and 16a and 16b are formed on the beams 5 to 8, respectively.

The base 1 has a center recess 17 (FIG. 3) so that weight 9 will not touch the base 1 when the weight 9 is shifted due to acceleration.

Figure 4:
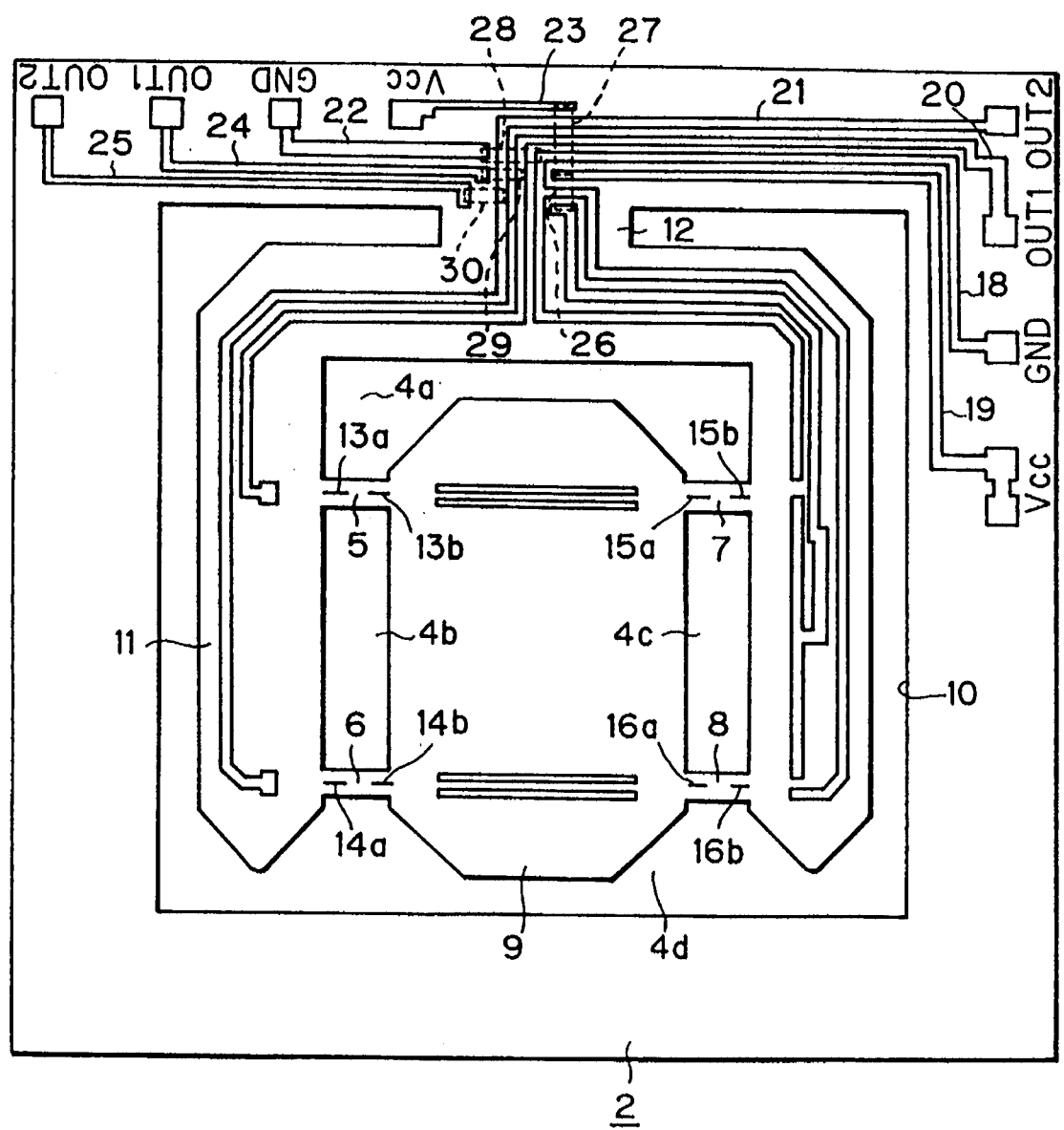
FIG. 4 is a plan view showing electrode patterns of the sensor.

FIG. 4 shows aluminum electrode patterns formed on the chip 2. The electrode patterns include ground electrode 18, source voltage electrode 19, and output electrode 20 and 21 for providing a potential difference corresponding to acceleration. There are another four sets of electrode including ground electrode 22, source voltage electrode 23, and output electrode 24 and 25 for providing a potential difference corresponding to acceleration.

An impurity diffusion layer 26 contacting with the source voltage electrode 19 is formed. A silicon oxide film is disposed on the diffusion layer 26, and the ground electrode 18 crossing the source voltage electrode 19 is arranged on the silicon oxide film. The source voltage electrode 23 is in contact with the source voltage electrode 19 through an impurity diffusion layer 27. The ground electrode 22 is in contact with the ground electrode 18 through an impurity diffusion layer 29. The output electrode 24 is in contact with the output electrode 20 through an impurity diffusion layer 29. The output electrode 21 and 25 are connected to each other through an impurity diffusion layer 30 for adjusting resistance.

Figure 5:
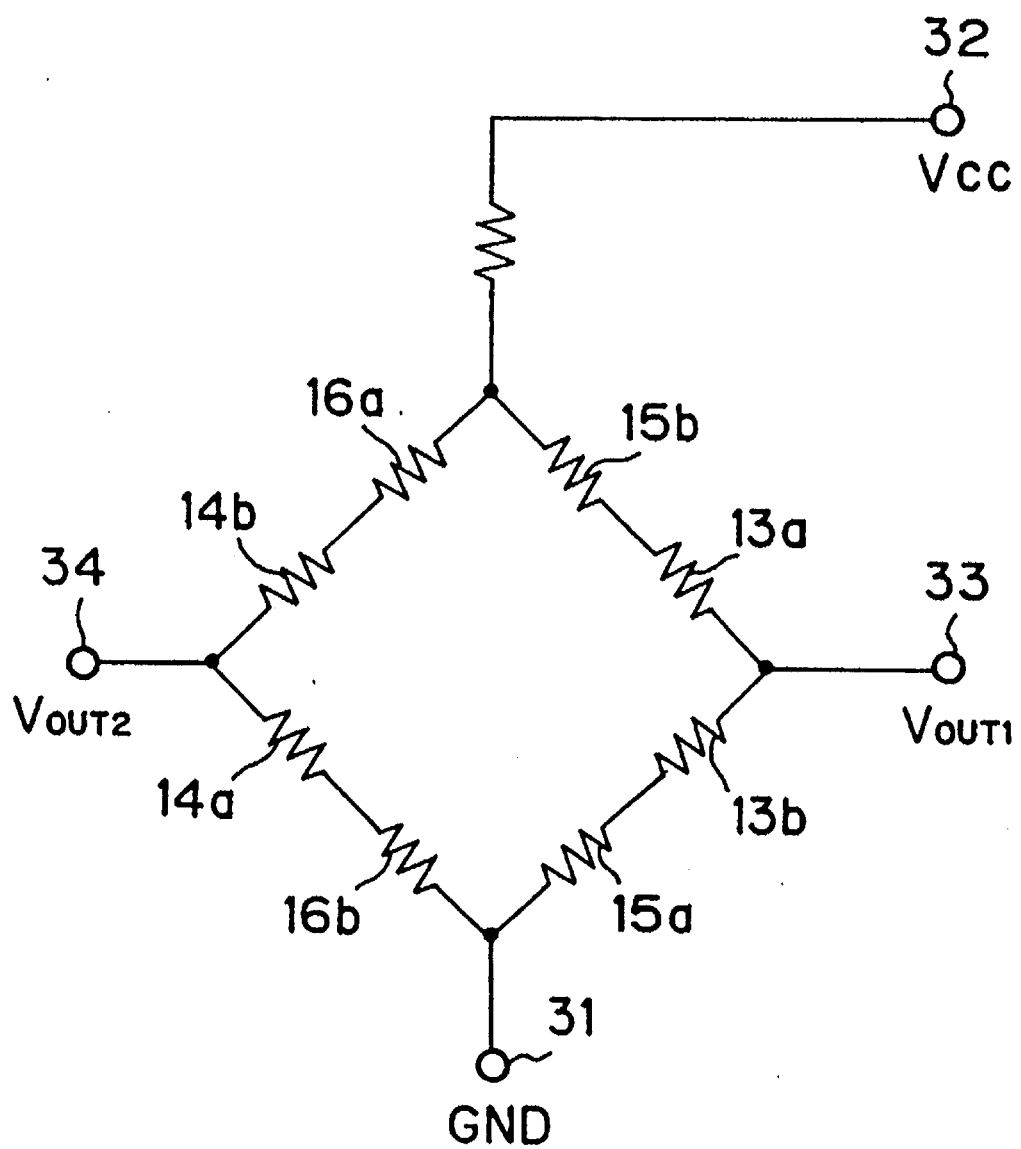
FIG. 5 is an electric connection diagram showing connections in a resistance layer of the sensor.

The piezoresistance layers 13a to 16b are electrically connected to form a Wheatstone bridge circuit shown in FIG. 5. This circuit includes a ground terminal 31, a source voltage terminal 32, and output terminals 33 and 34 for providing a potential difference corresponding to acceleration.

The present invention provides a method for producing a semiconductor device such as the semiconductor acceleration sensor explained above. The method basically involves a first step of forming a single-crystal semiconductor thin film of a second conduction type over a single-crystal semiconductor substrate of a first conduction type. A conductive material is formed in a scribe line area on the thin film. A third step of electrochemically etching with the conductive material transmitting etching electricity, to remove predetermined parts of the substrate. The substrate is diced into chips along the scribe line area so that each of the chips forms the semiconductor device.

Figure 9:
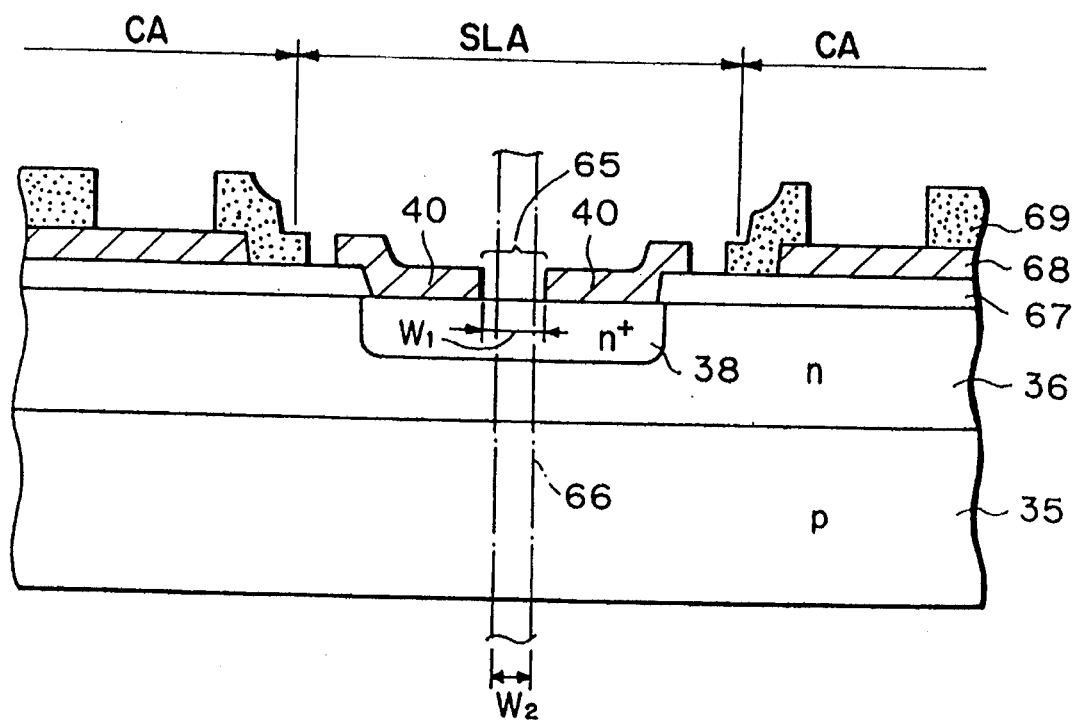
FIG. 9 is a sectional view taken along a line D—D of FIG. 8.

According to a first aspect of the present invention, the conductive material may be a metal thin film 40. It is preferable that the metal thin film has a clearance 65 for passing a dicing blade along the scribe line area, as shown in FIG. 9.

Namely, the first aspect of the present invention provides a method for producing a semiconductor device, including a first step of forming a single-crystal semiconductor thin film of the second conduction type over a single-crystal semiconductor substrate of the first conduction type. A metal thin film is formed in a scribe line area on the semiconductor thin film, but with the metal thin film having a clearance for passing a dicing blade. The substrate is then electrochemically etched the substrate with the metal thin film transmitting etching electricity, to remove predetermined parts of the substrate and leave predetermined parts of the semiconductor thin film. The substrate is then diced into chips along the scribe line area, so that each of the chips forms the semiconductor device.

The second step may form a high concentration diffusion layer of the second conduction type in the scribe line area and then form the metal thin film over the diffusion layer.

In this way, according to the first aspect of the present invention, the first step forms a single-crystal semiconductor thin film of the second conduction type over a single-crystal semiconductor substrate of the first conduction type. The second step forms a metal thin film in a scribe line area on the semiconductor thin film. The metal thin film has a clearance for passing a dicing blade. The third step electrochemically etches the semiconductor substrate with the metal thin film transmitting etching electricity, to remove predetermined parts of the substrate and leave predetermined parts of the semiconductor thin film. The fourth step cuts the substrate into chips along the scribe line area, so that each of the chips forms a semiconductor device. At this time, the dicing blade passes through the clearance formed on the metal thin film, so that the dicing will produce no metal dust.

The conductive material may be a high concentration diffusion layer 38 of the second conduction type.

It is preferable that the semiconductor thin film formed over the substrate is an epitaxial layer, and that the third step removes predetermined parts of the epitaxial layer.

It is preferable that a high concentration diffusion layer of the second conduction type is formed over the predetermined parts of the epitaxial layer that are removed in the third step.

The present invention also provides, according to its second aspect, a method for producing a semiconductor device, employing a first step of forming a single-crystal semiconductor thin film of the second conduction type over a single-crystal semiconductor substrate of the first conduction type. A second step forms a conductive material in a scribe line area on the thin film; a third step of immerses the substrate in a KOH-based etching liquid, electrochemically etches the substrate with the conductive material transmitting etching electricity, and stops the electrochemical etching at an inflection point where an etching current inflects to a constant level from a peak level, thereby removing predetermined parts of the substrate and leaving predetermined parts of the thin film. A fourth step dices the substrate into chips along the scribe line area, so that each of the chips may form the semiconductor device.

The third step may determine the inflection point when a predetermined period elapses after detecting the peak value and terminate the etching.

In this way, according to the second aspect of the present invention, the first step forms a single-crystal semiconductor thin film of the second conduction type over a single-crystal semiconductor substrate of the first conduction type. The second step forms a conductive material in a scribe line area on the thin film. The third step immerses the substrate in a KOH-based etching liquid, electrochemically etches the substrate with the conductive material transmitting etching electricity, and stops the electrochemical etching at an inflection point where an etching current inflects to a constant level from a peak level, thereby removing predetermined parts of the substrate and leaving predetermined parts of the thin film. The fourth step dices the substrate into chips along the scribe line area, so that each of the chips may form a semiconductor device.

The electrochemical etching is terminated at an optimum time according to the inflection point. Namely, the etching is terminated after all chips on a wafer are properly etched, considering the surface distribution of the thickness of the substrate.

Embodiments according to these aspects will be explained with reference to FIGS. 6 to 26.

Figure 6:
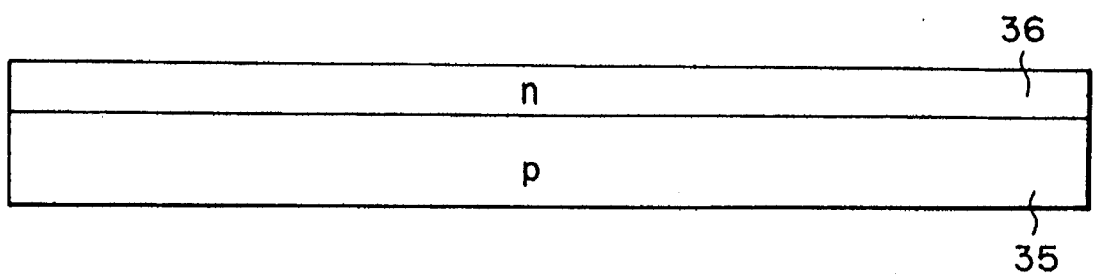
FIGS. 6 and 7 are sectional views showing steps for producing the sensor, according to the present invention.

In FIG. 6, a p type single-crystal silicon wafer 35 is prepared. An n type epitaxial layer 36 is formed over the wafer 35.

Figure 7:
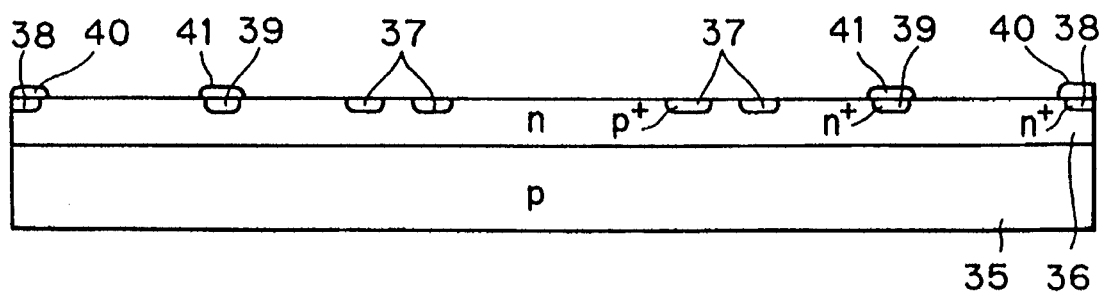

In FIG. 7, a $p^+$ type diffusion layer 37 is formed on the epitaxial layer 36 in an area where a piezoresistance layer is to be formed. An n⁺ type diffusion layer 38 is formed in a scribe line area. An n⁺ type diffusion layer 39 is formed in an area where through holes 10, 4a, 4b, 4c, and 4d (FIG. 2) are to be formed. An aluminum film 40 is formed over the n⁺ type diffusion layer 38. Pads are connected to the aluminum film 40. An aluminum thin film 41 is formed over the n⁺ type diffusion layer 39.

Figure 8:
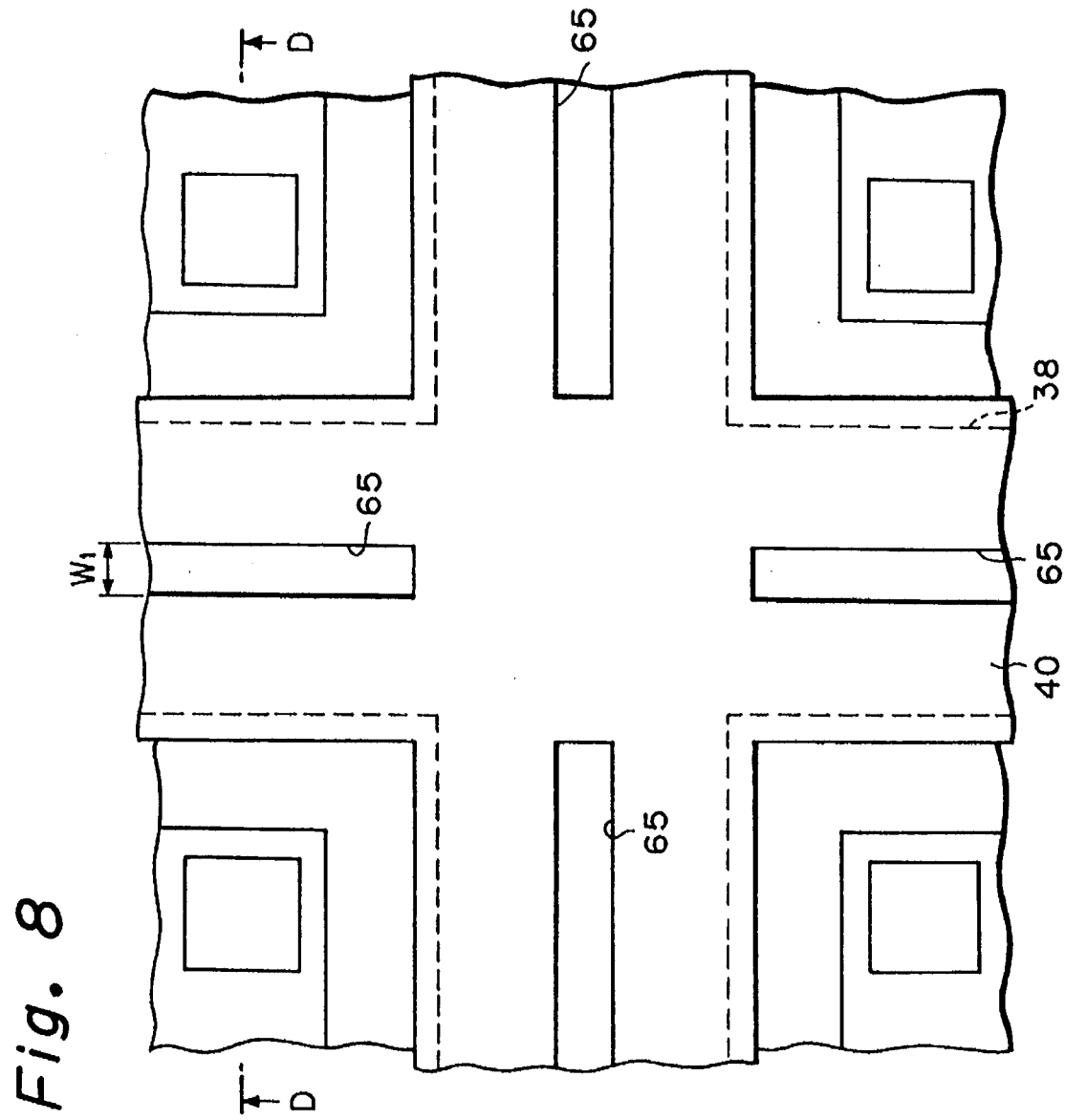
FIG. 8 is a plan view showing an intersection of an aluminum electrode of the sensor under fabrication.

FIG. 8 is a plan view showing an intersection of the aluminum film 40. FIG. 9 is a sectional view taken along a line D—D of FIG. 8. The aluminum film 40 is disposed in the scribe line area. A clearance 65 for passing a dicing blade 66 is formed along the center line of the aluminum film 40. The width W1 of the clearance 65 is slightly wider than the width W2 of the dicing blade 66. Since the dicing blade 66 passes through the clearance 65 of the aluminum film 40, the dicing blade 66 is away from the aluminum film 40.

In FIG. 8, the clearance 65 does not cross each intersection of the aluminum film 40. This arrangement reduces resistance in the aluminum film 40 that serves as a current supply path for electrochemical etching.

FIG. 9 also shows a silicon oxide film 67, aluminum electrode 68, and a passivation film 69.

Figure 10:
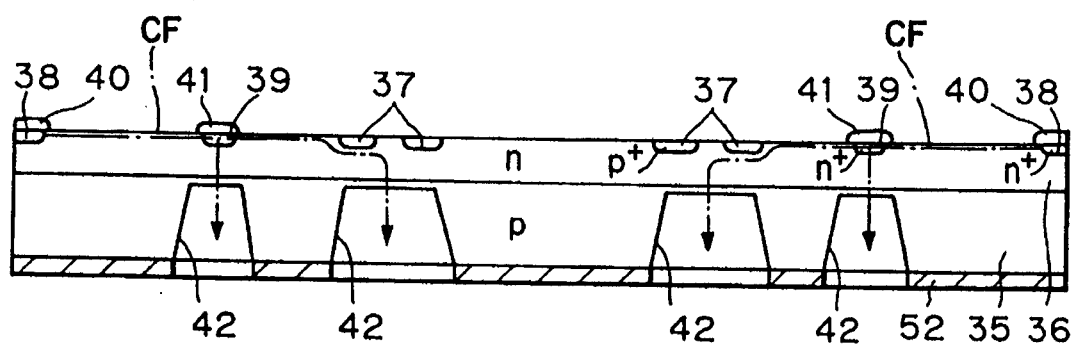
FIG. 10 is a sectional view showing another step for producing the sensor, according to the present invention.

In FIG. 10, a plasma nitride film (P-SiN) 52 is formed on the back of the wafer 35. The film 52 is patterned by photoetching. A current is supplied to the pads on the aluminum film 40, to electrochemically etch the wafer (substrate) 35 with the n⁺ type diffusion layer 38 serving as an electrode.

The electrochemical etching will be explained in detail with reference to FIG. 11.

The wafer 35 is immersed in a KOH aqueous solution 76 (33 weight percent at 82 degrees centigrade). A platinum (Pt) electrode 70 is put in the solution 76, to face the wafer 35. A constant voltage source (two volts) 71, an ammeter 72, and a switch 73 are connected in series between the aluminum film 40 of the wafer 35 and the electrode 70. A controller 74 such as a microcomputer is connected to a start switch 75, the ammeter 72, and switch 73. The controller 74 starts etching in response to a start signal from the start switch 75 and detects a current in response to a signal from the ammeter 72. The controller 74 opens and closes the switch 73.

Figure 12:
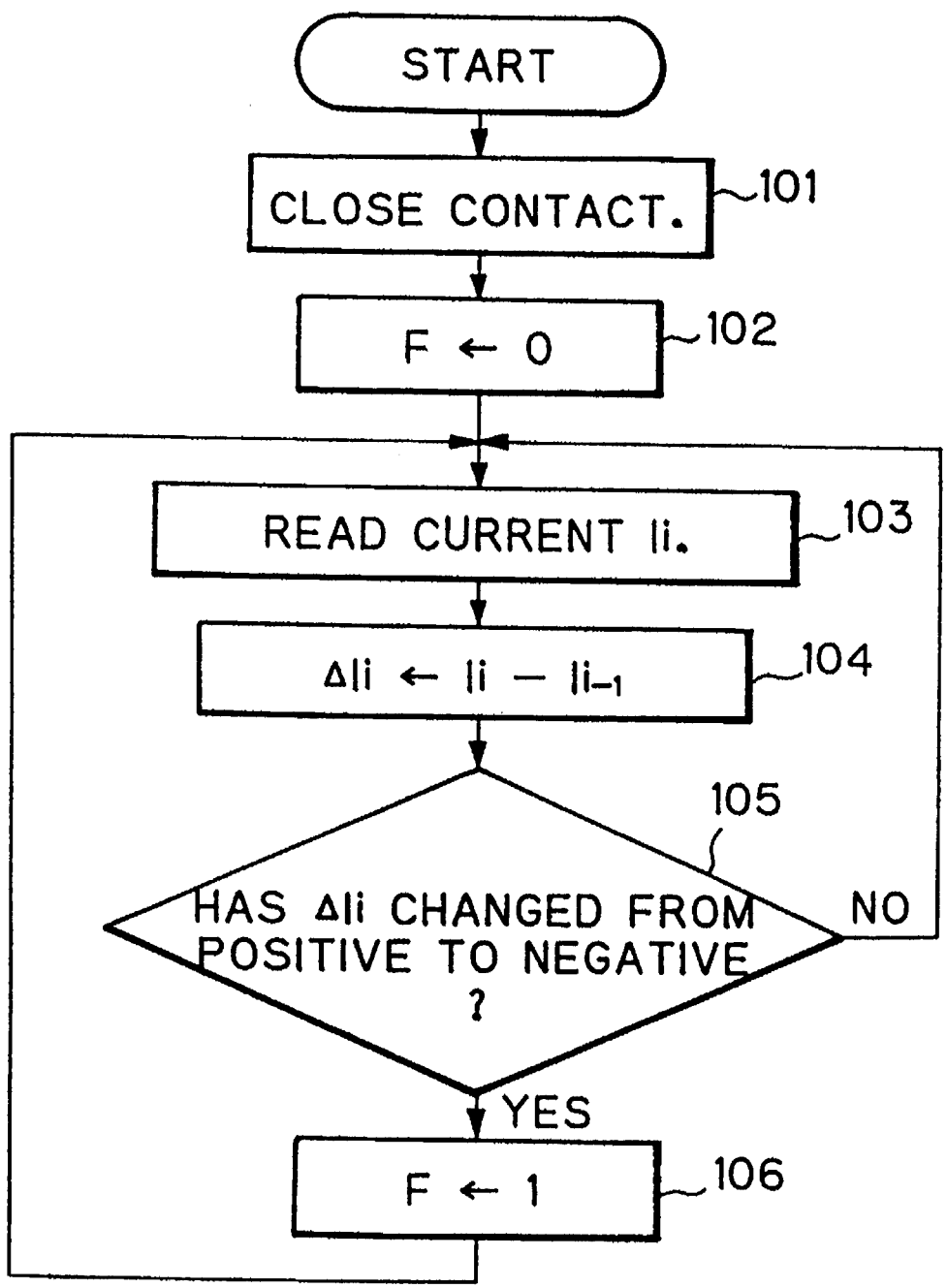
FIGS. 12 and 13 are flowcharts showing electrochemical etching steps.
Figure 13:
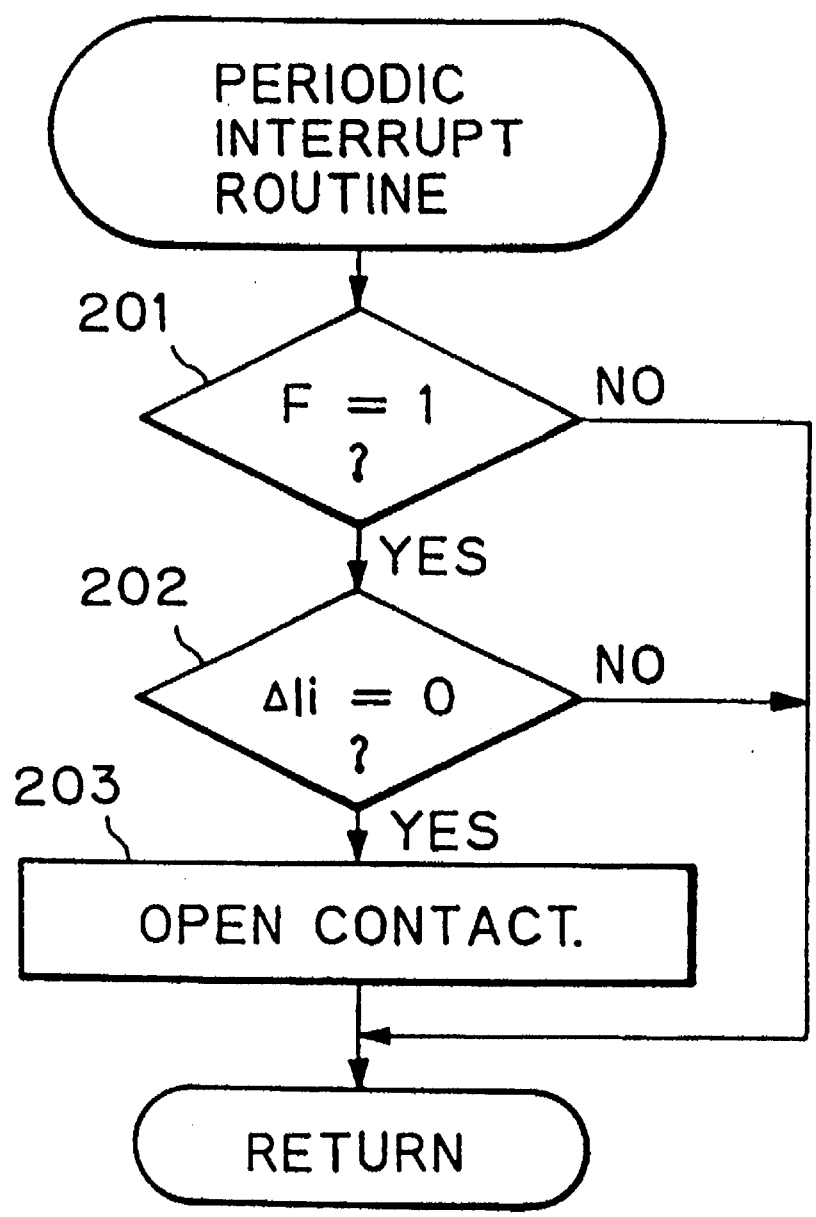
Figure 14:
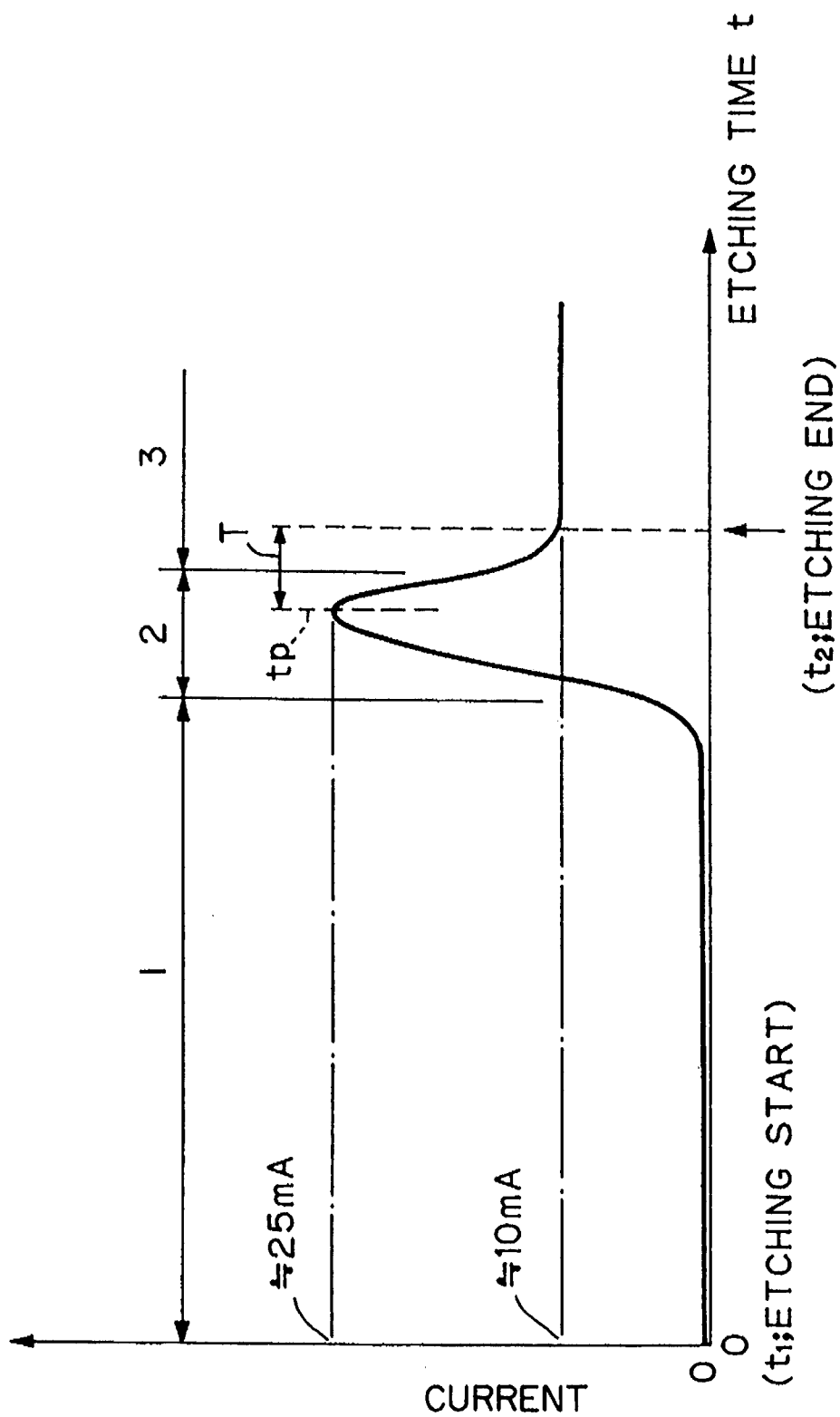
FIG. 14 is a time chart showing changes in an electrochemical etching current.

FIGS. 12 and 13 show etching steps carried out by the controller 74. These steps will be explained with reference to a timing chart of FIG. 14. An ordinate of FIG. 14 represents etching current values.

Upon receiving an etching start signal from the start switch 75, the controller 74 starts the steps of FIG. 12. In step 101, the controller 74 closes the switch 73. In step 102, the controller 74 sets a flag F to 0. In step 103, the controller 74 reads a present current value Ii from the ammeter 72. In step 104, the controller 74 calculates a difference ΔIi (=Ii−I$_{i-1}$) where I$_{i-1}$ is a previous current value.

In step 105, the controller 74 determines whether or not the difference ΔIi has changed from positive to negative. Namely, it determines whether or not a peak value (at time tp in FIG. 14) has been obtained. If the difference ΔIi has not changed from positive to negative, the flow returns to step 103, and if it has changed, the controller 74 sets the flag F to 1 in step 106.

The controller 74 periodically carries out an interrupt routine of FIG. 13. In step 201, the controller 74 tests if the flag F is 1. If F=0, the interrupt process ends. If F=1, the controller 74 determines, in step 202, whether or not the current difference ΔIi is 0. During a period of tp to t2 of FIG. 14, the difference ΔIi is negative and not zero, so that the interrupt ends. If the difference ΔIi is zero at time t2 of FIG. 14, the controller 74 opens, in step 203, the switch 73. Then, the interrupt ends. Just after that, the wafer 35 is picked up from the solution 76 and washed with pure water. This completes the electrochemical etching.

Changes in the etching current will be explained with reference to FIG. 14.

During a first period (1) after the start of the etching, KOH and silicon chemically react with each other to etch the wafer 35. This etching is accomplished because a voltage is supplied to the aluminum film 40 and because no current flows to the wafer 35 due to a pn junction formed between the wafer 35 and the epitaxial layer 36.

During a second period (2), a peak current appears. At the same time, the wafer 35 is etched to the pn junction, the epitaxial layer 36 receiving the voltage comes in contact with the KOH aqueous solution, to cause a current to flow, and silicon on the surface of the epitaxial layer 36 is oxidized due to the current. The peak in the period (2) has a slope due to a surface distribution of the thickness (thickness fluctuations) of the wafer 35.

During a third period (3), the current drops to a level that is higher than the level of the first period (1). This is because the silicon oxides are also etched, though slowly, and the etching of the silicon oxides and the oxidation of silicon are balanced. More precisely, the speed of the etching of the silicon oxides by the KOH aqueous solution is about one hundredth of that of silicon, so that the silicon is nearly completely etched.

The inflection point of the etching current to the flat level due to the silicon oxidation after the current peak in the second period (2) corresponds to an end of the etching.

Figure 11:
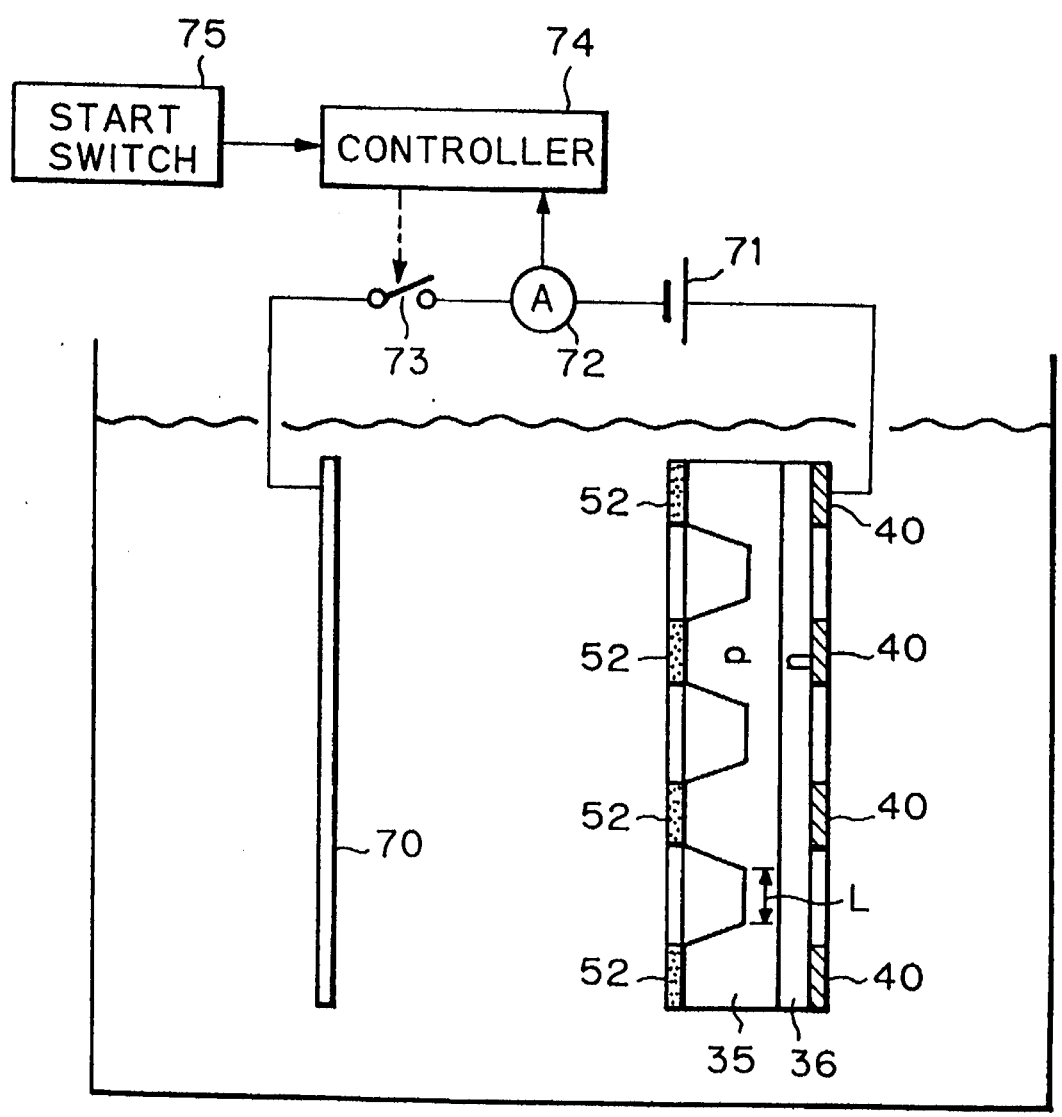
FIG. 11 is a schematic view showing an electrochemical etching apparatus.

In FIG. 11, the diameter of the wafer 35 is 10 centimeters, and a total etched area indicated with L is 17.4 square centimeters.

Within each chip area on the wafer 35, the n⁺ type diffusion layer 39 exists in a predetermined area on the epitaxial layer 36, as shown in FIG. 10. The layer 39 helps a current to horizontally flow from the n⁺ type diffusion layer 38 toward the face to be electrochemically etched, without being blocked by resistance. Namely, the layer 39 reduces horizontal resistance in the epitaxial layer 36, so that parts that are distal from the voltage supply layer 38 may receive a sufficient amount of current, to form an anodic oxidation film. This results in easily stopping the etching.

In practice, the etching is stopped by a depletion layer extending from the pn junction toward the substrate 35. Accordingly, the semiconductor material of the substrate 35 will slightly remain on the junction between the substrate 35 and the epitaxial layer 36.

Figure 15:
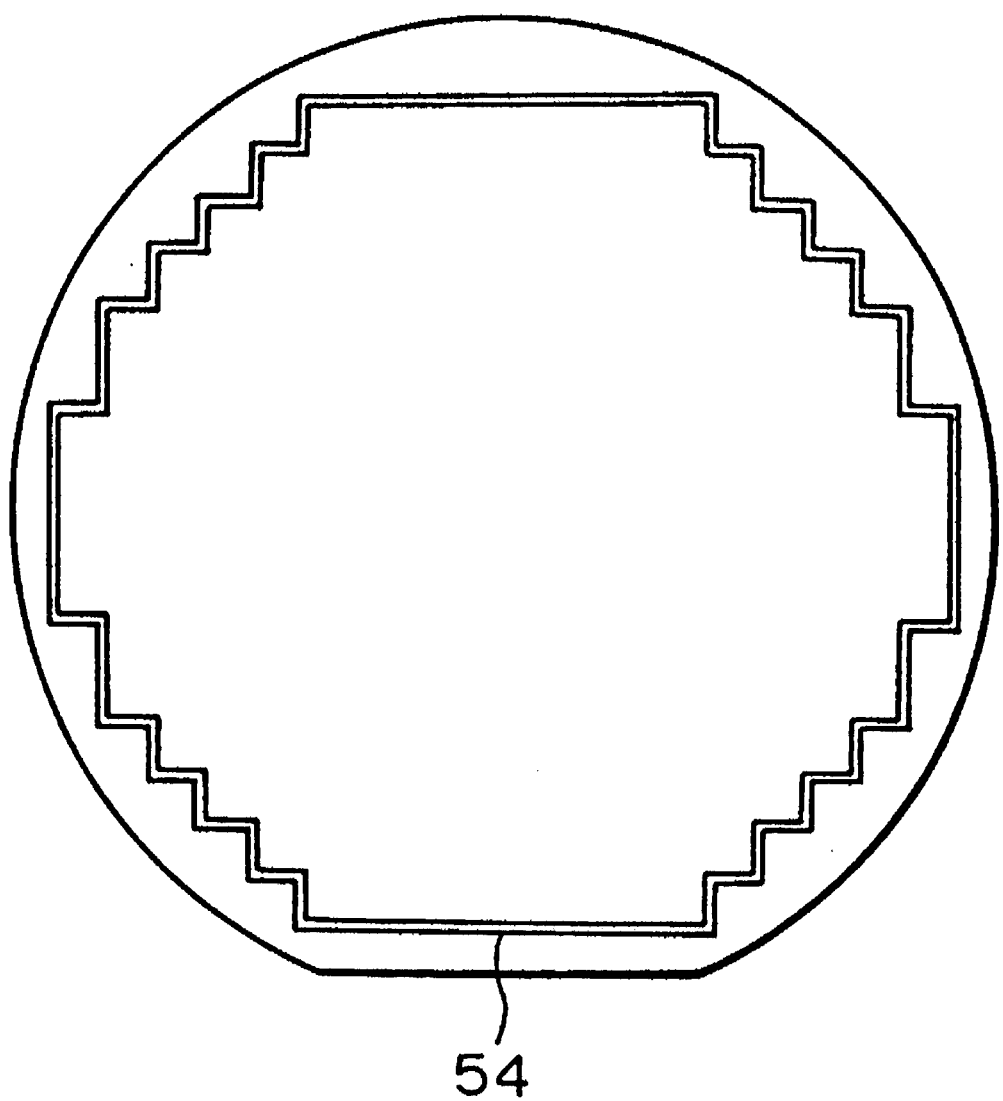
FIG. 15 is a plan view showing a silicon wafer from which the sensors are formed.
Figure 16:
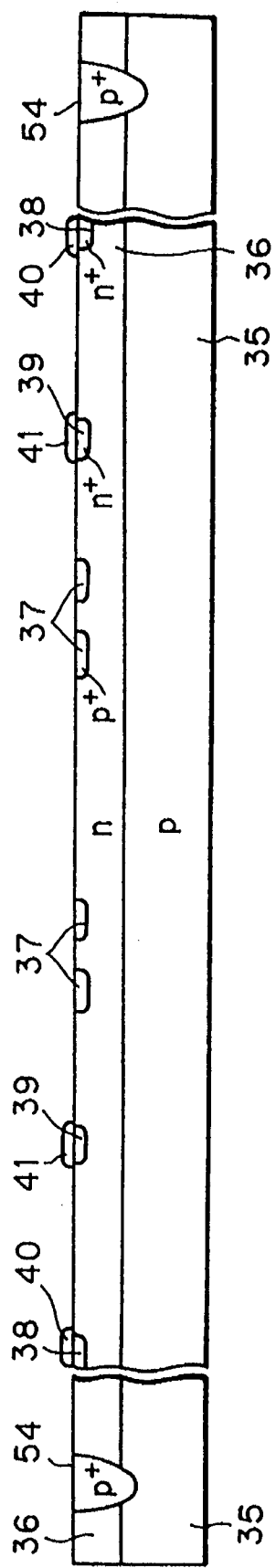
FIGS. 16 to 20 are sectional views showing steps for processing the wafer into the sensors, according to the present invention.

In FIGS. 15 and 16, a p⁺ type diffusion layer 54 may be formed on the periphery of a chip forming area of the epitaxial layer 36. The bottom of the diffusion layer 54 reaches the wafer 35. During the electrochemical etching process, the pn junction at the periphery of the wafer 35 will cause a leak as indicated with B in FIG. 17. The diffusion layer 54 isolates the leak causing part from etched parts to thereby prevent the leak. This results in accurately forming a diaphragm having a uniform thickness.

Figure 17:
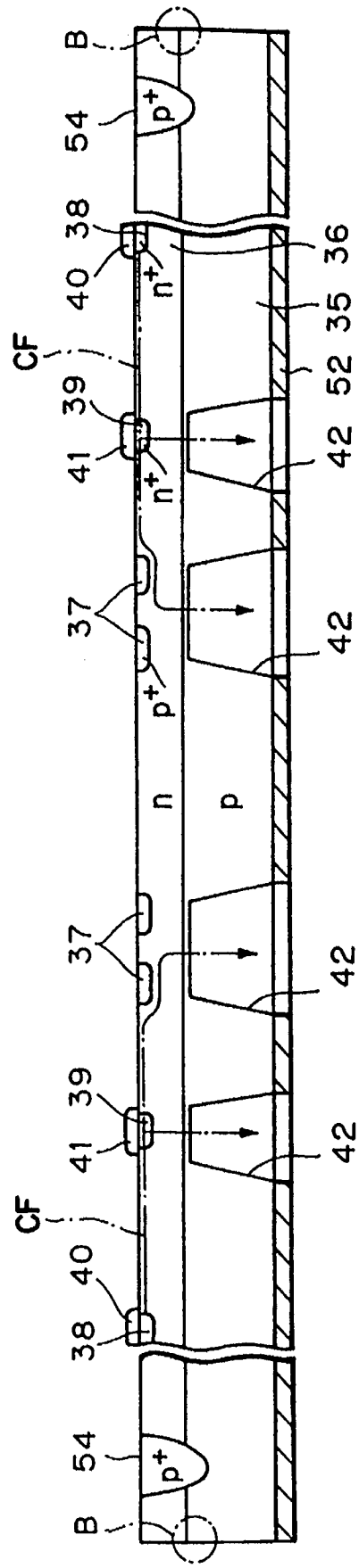

If there is no p⁺ type diffusion layer 54, potential at the periphery of the epitaxial layer 36 will be equal to that at the central part of the layer 36, so that the part B of FIG. 17 will cause a leak.

On the other hand, the periphery of the epitaxial layer 36 having the p⁺ type diffusion layer 54 will have the same potential as the wafer (substrate) 35, so that no leak will happen.

Figure 18:
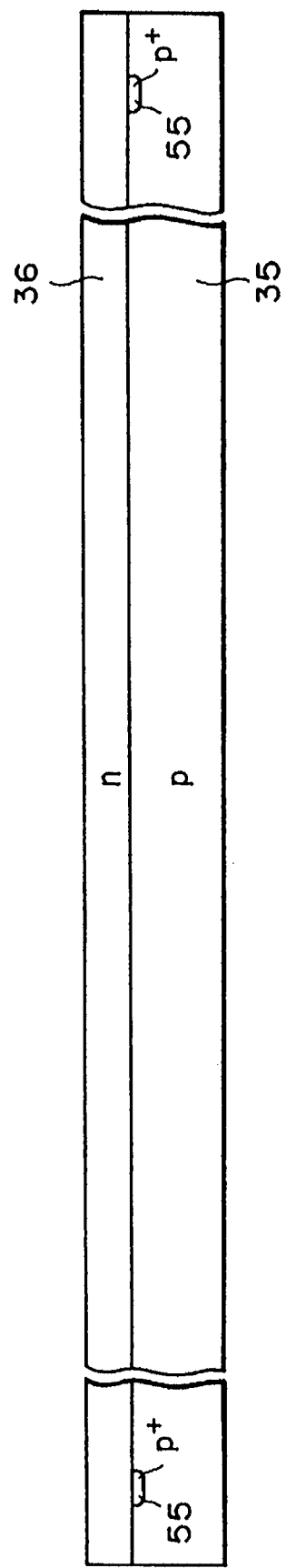
Figure 19:
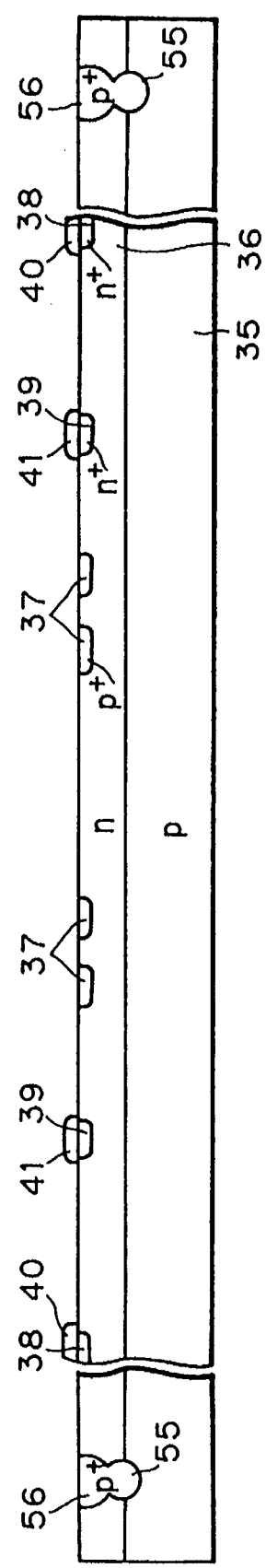
Figure 20:
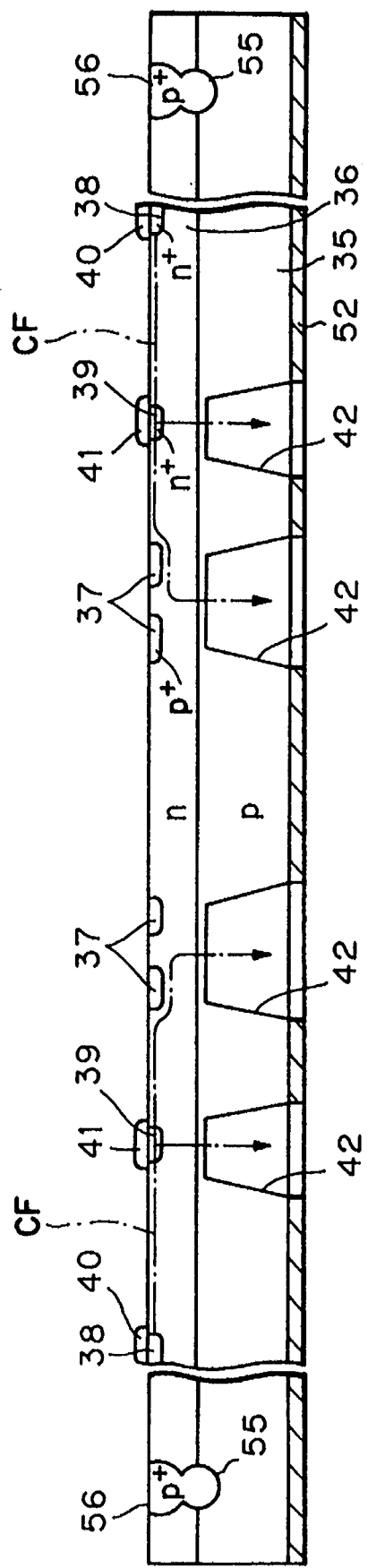

FIGS. 18 to 20 show processes for forming the leak preventive high concentration diffusion layer 54.

In FIG. 18, a $p^+$ type buried layer 55 is formed on a p type single-crystal silicon wafer 35. An n type epitaxial layer 36 is formed on the wafer 35. In FIG. 19, a $p^+$ type diffusion layer 56 is formed in the epitaxial layer 36 by heat treatment in an oxygen atmosphere, to reach the buried layer 55. Then, the electrochemical etching is performed as shown in FIG. 20. When the epitaxial layer 36 is thick, this technique is advantageous because it can reduce a time necessary for forming the $p^+$ type diffusion layer 55 up to the wafer 35.

FIGS. 21 to 24 show an example of an electrochemical etching technique.

Figure 21:
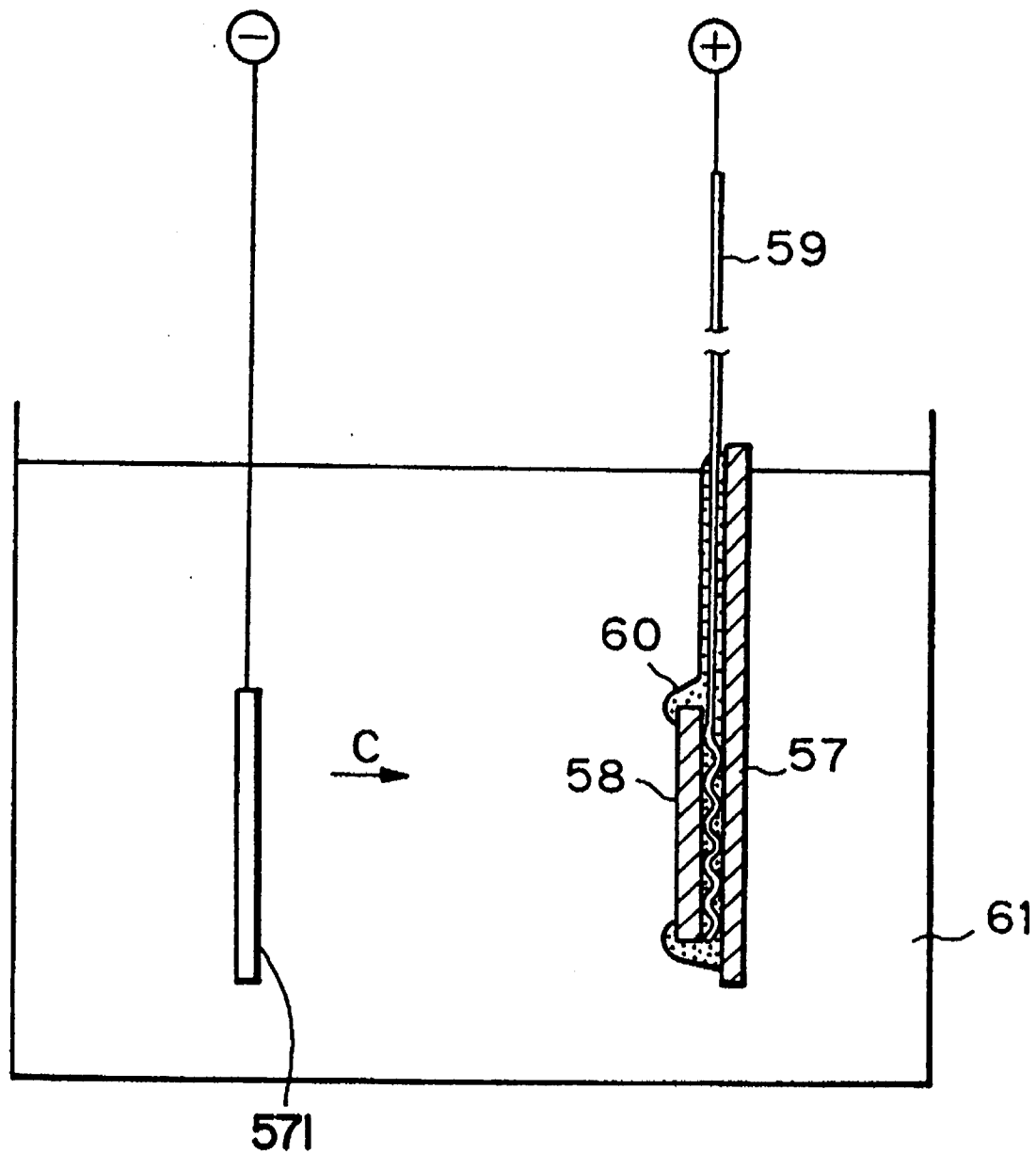
FIG. 21 is a sectional view showing an electrochemical etching operation.
Figure 22:
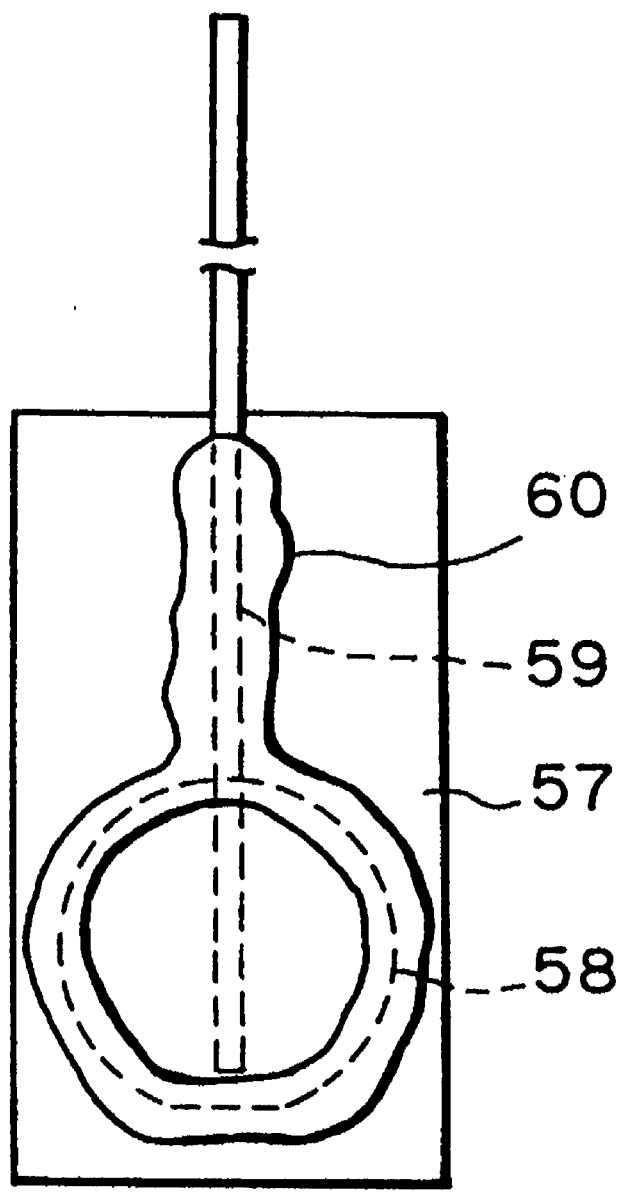
FIG. 22 is a view showing a wafer seen from an arrow mark C of FIG. 21.

In FIGS. 21 and 22, a platinum ribbon 59 is held between an alumina support 57 and a silicon wafer 58. The wafer 58 is fixed to the support 57 with resin 60 such as heat resistant wax. The resin 60 protects the wafer 58 and platinum ribbon 59 from an etching liquid 61 such as a 33 weight percent KOH solution at 82 degrees centigrade. A platinum electrode 571 (opposite electrode is also present.)

Figure 23:
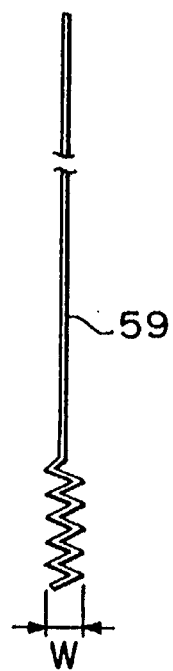
FIG. 23 is a side view showing a platinum ribbon of FIG. 21.

In FIGS. 22 and 23, an end of the platinum ribbon 59 is corrugated. When no external force is applied, the corrugated part of the ribbon 59 has a thickness of W. When the ribbon 59 is firmly held between the support 57 and the wafer 58, the thickness of the corrugated part of the ribbon 59 is compressed to less than W. This results in producing a force pushing the wafer 58 away from the support 57. Under this state, the ribbon 59 is surely electrically connected to the wafer 58.

Figure 24:
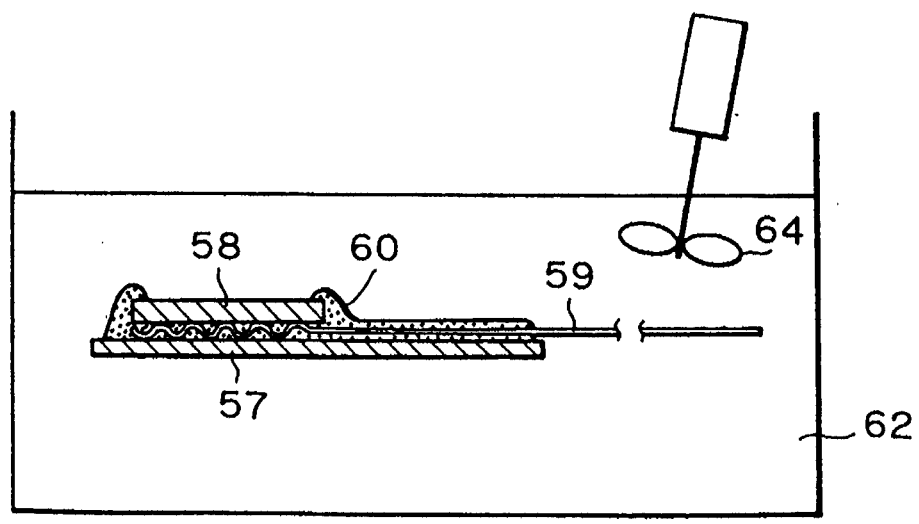
FIG. 24 is a sectional view showing the wafer in a sensor production process.

In FIG. 24, the wafer 58 is immersed in a solvent 62 such as a trichloroethane solvent to liquefy the resin 60 and is then picked up from the solvent. At this time, the corrugated part of the platinum ribbon 59 pushes the wafer 58 away from the support 57, so that the solvent 62 stirred with a mixer 64 rapidly removes the wafer 58 from the support 57. If the ribbon 59 is flat, the wafer 58 will be tightly attached to the support 57 with the resin 60 and it will take a longer time to peel the wafer 58 off from the support 57.

The electrochemical etching removes the predetermined parts of the wafer 35, to form grooves 42 as shown in FIG. 10, and leaves the predetermined parts of the epitaxial layer 36, to form the movable thin beams 5, 6, 5, and 8 (FIG. 2).

Figure 25:
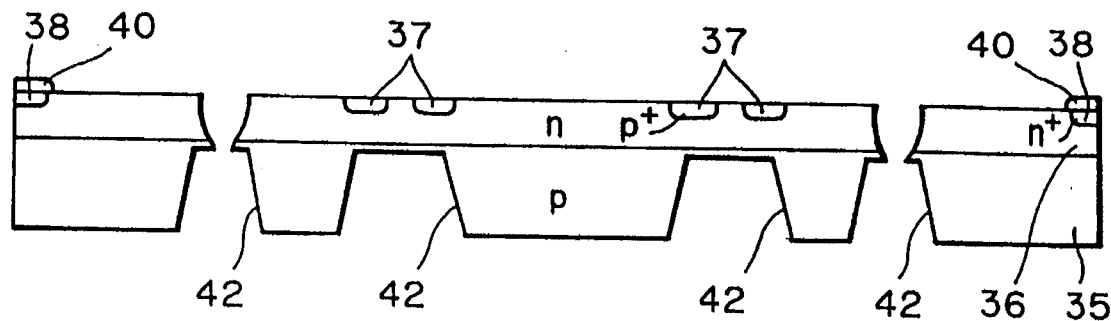
FIGS. 25 and 26 are views showing steps for producing the sensors, according to the present invention.

In FIG. 25, parts including the $n^+$ type diffusion layer 39 are removed from the epitaxial layer 36, to open the grooves 42 to form the through holes 4a, 4b, 4c, 4d, and 10 shown in FIG. 2. Thereafter, the wafer 35 is anodically joined with the base 1 made of Pyrex glass.

Figure 26:
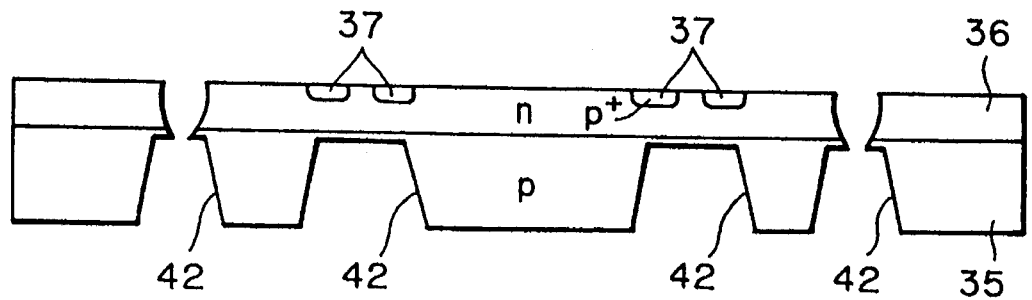

In FIG. 26, the wafer 35 and base 1 are diced along the scribe line area into chips (FIG. 26 showing one of the chips). At this time, the dicing blade 66 passes through the clearance 65 of the aluminum film 40 as shown in FIG. 9. Namely, the dicing blade 66 does not contact with the aluminum film 40, so that no metal dust will be produced.

As explained above, the first step forms an n type thin epitaxial layer 36 (a single-crystal semiconductor thin film of second the conduction type) over a p type single-crystal silicon wafer 35 (a single-crystal semiconductor substrate of the first conduction type). The second step forms an aluminum film 40 (a metal thin film) in a scribe line area on the epitaxial layer 36. The aluminum film 40 has a clearance 65 for passing a dicing blade. The third step electrochemically etches the wafer 35 with the aluminum film 40 transmitting etching electricity, to remove predetermined parts of the wafer 35 and leave predetermined parts of the epitaxial layer 36. The fourth step cuts the wafer 35 into chips along the scribe line area. Each of the chips forms a semiconductor device.

In the step 4, the dicing blade 66 passes through the clearance 65 of the aluminum film 40, so that no metal dust is produced to adhere to and damage the chips. If the scribe line area has no clearance 65 for passing the dicing blade 66, it will be difficult to find the scribe line area to be cut because the aluminum film 40 is covering the scribe line area. According to the present invention, the clearance 65 serves as a guide line for guiding the dicing blade 66, to accurately dice the wafer 35 into chips along the scribe line area.

An $n^+$ type diffusion layer 38 (a high concentration diffusion layer of the second conduction type) may be formed in the scribe line area on the epitaxial layer 36, and then the aluminum film 40 may be formed over the diffusion layer 38. The diffusion layer 38 serves as an electrode to secure an electrical connection path.

Since the aluminum film 40 and $n^+$ type diffusion layer 38 are disposed in the scribe line area and since the $n^+$ type diffusion layer 39 is disposed in the through hole forming area, there is no need to expand each chip area for accommodating these layers and films 38, 39, and 40.

In FIG. 8, each intersection of the aluminum film 40 has no clearance 65 for passing the dicing blade 66. The clearance 65 may be formed across each intersection of the aluminum film 40. This may increase resistance but the dicing blade 66 never gets in contact with the aluminum film 40 even at each intersection of the film so that metal (aluminum) dust is completely prevented.

Step 105 of FIG. 12 may determine whether or not a predetermined period T shown in FIG. 14 has elapsed. The period T within which a current reaches an inflection point from a peak level to a constant level is empirically obtained. As soon as the period T (for example, five minutes) passes, the electrochemical etching is stopped.

Figure 27:
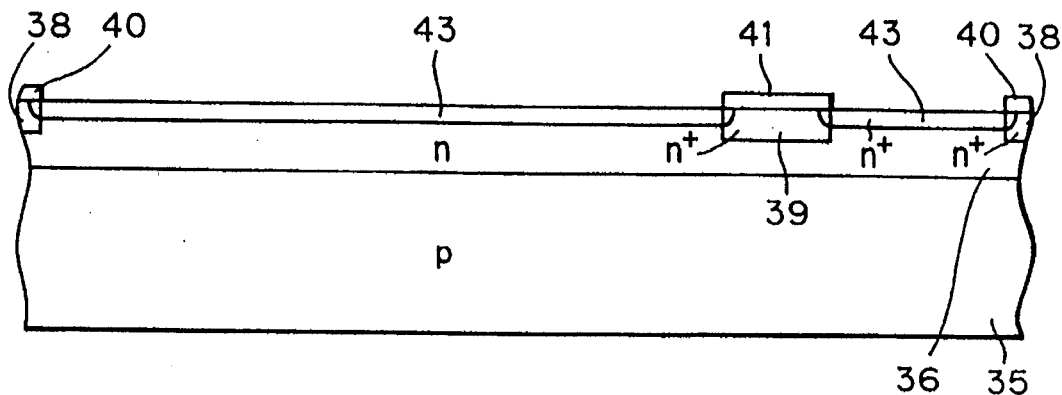
FIGS. 27 and 28 are sectional views showing steps for producing semiconductor devices, according to modifications of the present invention.

FIG. 27 shows a modification according to the present invention. An $n^+$ type diffusion layer 43 is formed over an epitaxial layer 36 except parts where piezoresistance layers 13a to 16b (FIG. 4) are to be formed, and an $n^+$ type diffusion layer 39 is electrically connected to an aluminum film 40 through the layer 43.

Figure 28:
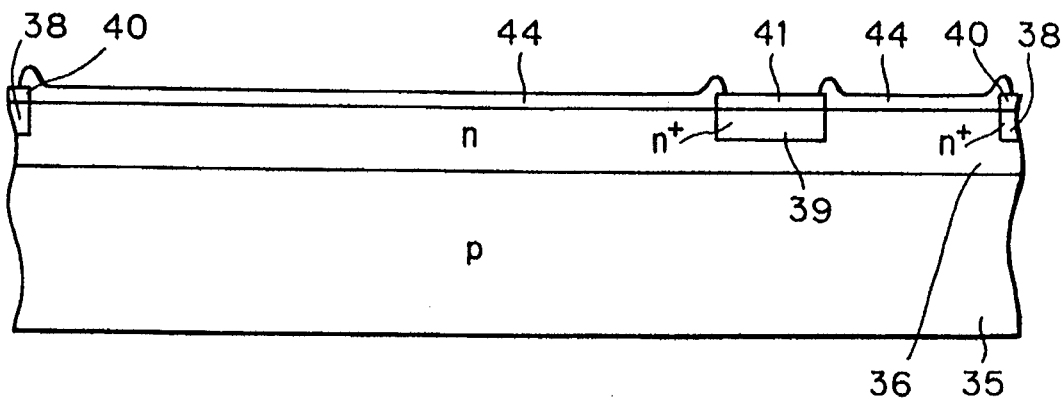

FIG. 28 shows another modification according to the present invention. An aluminum film 44 is formed over an epitaxial layer 36 except parts where piezoresistance layers 13a to 16b and wiring 18 to 30 (FIG. 4) are to be formed, and an aluminum film 41 is electrically connected to an aluminum film 40 through the film 44.

FIGS. 29 to 35 show another method for forming semiconductor devices, according to the present invention.

Figure 29:
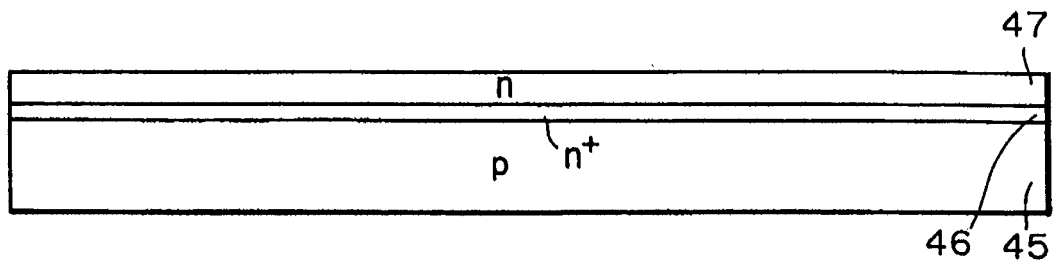
FIGS. 29 to 35 are sectional views showing steps for producing a semiconductor sensor, according to another embodiment of the present invention.

In FIG. 29, an $n^+$ type diffusion layer 46 is formed by thermal diffusion or ion implantation over a p type single-crystal silicon wafer (substrate) 45. An n type epitaxial layer 47 is formed over the diffusion layer 46.

Figure 30:
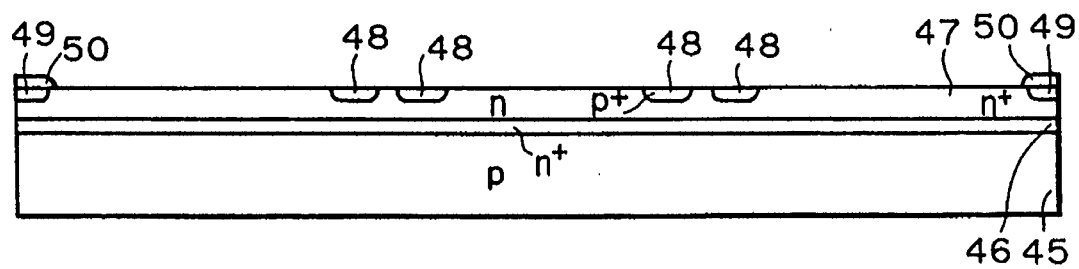

In FIG. 30, a $p^+$ type diffusion layer 48 is formed in a predetermined area on the epitaxial layer 47 where a piezoresistance layer is to be formed. An $n^+$ type diffusion layer 49 is formed in a scribe line area. An aluminum thin film 50 is formed over the diffusion layer 49. Similar to the embodiment of FIGS. 8 and 9, the aluminum film 50 has a clearance 65 for passing a dicing blade 66.

Figure 31:
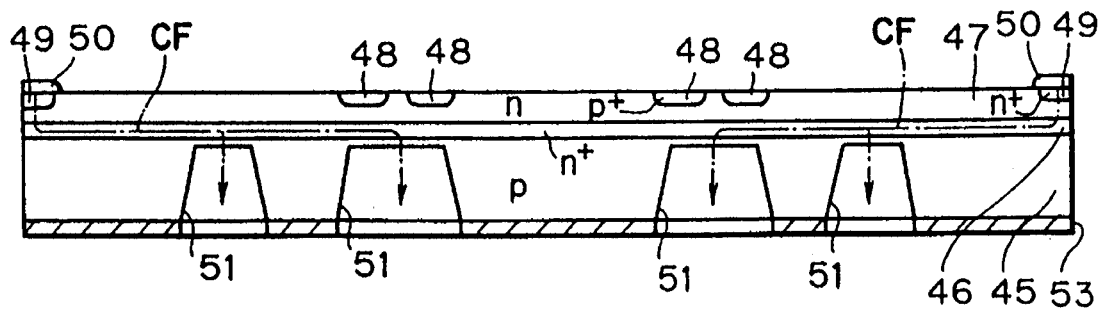

In FIG. 31, a plasma nitride film (P-SiN) 53 is formed over the back of the wafer 45. The film 53 is patterned by photoetching. With diffusion layer 49 in the scribe line area serving as an electrode, predetermined parts of the wafer 45 are electrochemically etched, to form grooves 51. At this time, predetermined parts of the layers 46 and 47 are left.

The electrochemical etching is carried out similar to the first embodiment of FIGS. 11 to 14. Namely, the wafer 45 is immersed in a KOH aqueous solution and electrochemically etched. At an inflection point to a constant current value from a peak, the etching is stopped. As a result, the predetermined parts of the wafer 45 are removed and the predetermined parts of the epitaxial layer 47 are left.

During the electrochemical etching, the $n^+$ type diffusion layer 46 interposing between the wafer 45 and the epitaxial layer 47 helps a current to sufficiently flow from the diffusion layer 49 to the parts to be etched, as shown in FIG. 31. Namely, the layer 46 reduces horizontal resistance of the epitaxial layer 47 acting against the current, so that even parts that are distal from the voltage supply source may receive a sufficient current, an anode oxide film may be smoothly formed, and the etching may be easily stopped.

Figure 32:
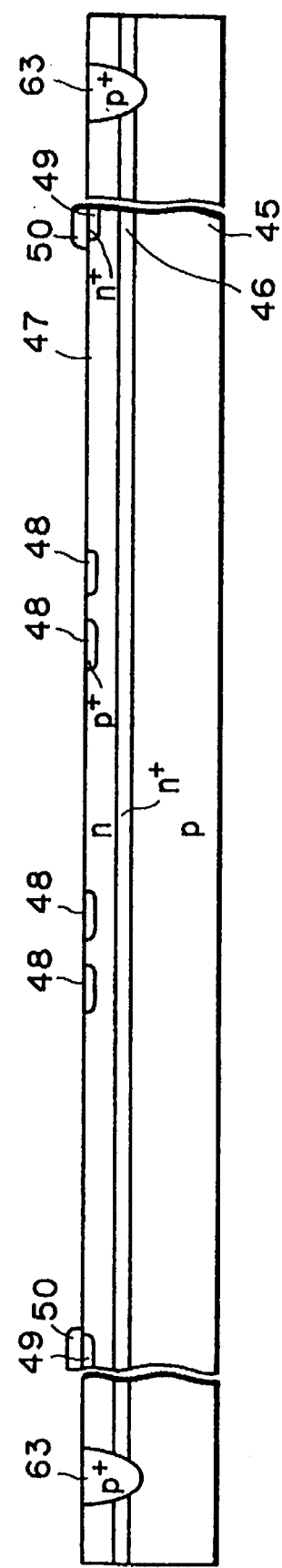
Figure 33:
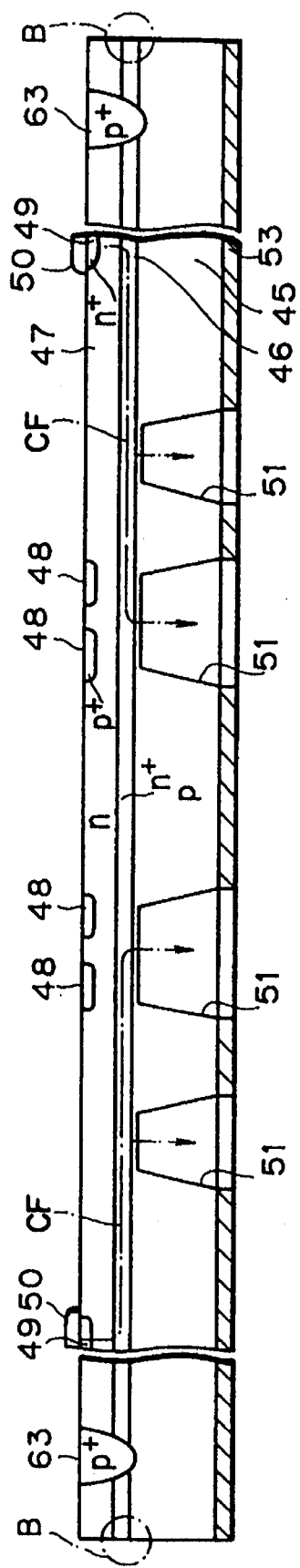

In FIG. 32, a $p^+$ type diffusion layer 63 is formed on the periphery of a chip forming area of the epitaxial layer 47. The depth of the diffusion layer 63 reaches the wafer 45. During the electrochemical etching, the pn junction at the periphery of the wafer 45 will cause a leak as indicated with B in FIG. 33. Reference CF indicates the current flow in FIG. 33. The diffusion layer 63 isolates the leak causing part from parts to be etched, to thereby prevent the leak. This results in accurately forming a diaphragm having a uniform thickness.

The leak preventive high concentration diffusion layer 63 may be formed in the same manner as explained with reference to FIGS. 18 to 20. Namely, a $p^+$ type buried layer is formed in the wafer 45, and a $p^+$ type diffusion layer is formed in the epitaxial layer 47, to reach the buried layer.

Figure 34:
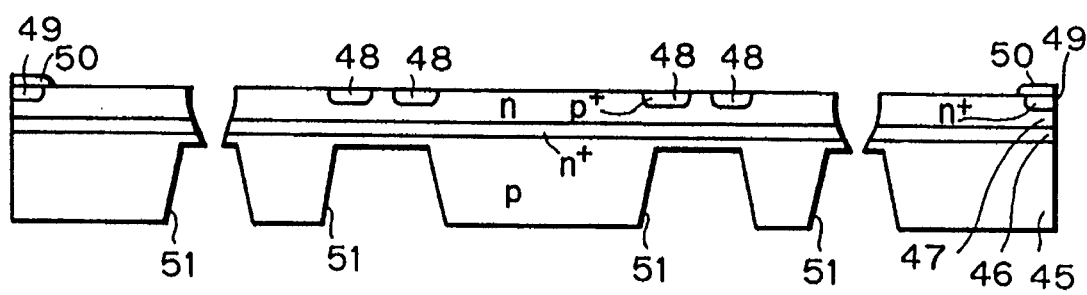
Figure 35:
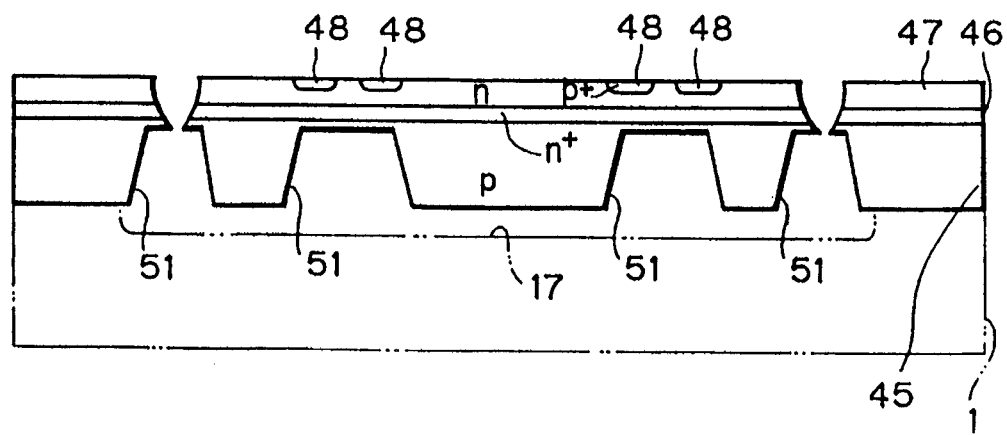

In FIG. 34, predetermined parts of the diffusion layer 46 and epitaxial layer 47 are removed to open the grooves 51. The wafer 45 is anodically joined with a base 1 made of Pyrex glass, as shown in FIG. 35. The wafer 45 and base 1 are diced into chips along the scribe line area, so that each of the chips forms a semiconductor device.

At this time, the dicing blade 66 passes through the clearance 65 of the aluminum film 50 as in the case of FIG. 9. Accordingly, the dicing blade 66 does not get in contact with the aluminum film 50.

Instead of forming the diffusion layer 46 over the wafer 45, the epitaxial layer may have double layers including an $n^+$ type lower layer and an n type upper layer.

In this way, the present invention solves the problem arising when dicing a metal thin film used for electrochemical etching and terminates the etching at optimum time.

The present invention also provides, according to its third aspect, a method for producing a semiconductor device, including a first step of forming an epitaxial layer of the second conduction type over a single-crystal semiconductor substrate of the first conduction type. A second step forms a high concentration diffusion layer of the second conduction type in a scribe line area on the epitaxial layer as well as a high concentration diffusion layer of second conduction type in a predetermined area within each chip area on the epitaxial layer. A third step of electrochemically etches predetermined parts of the substrate with the diffusion layer in the scribe line area serving as an electrode, to leave predetermined parts of the epitaxial layer, and a fourth step dices the substrate into chips along the scribe line area, so that each of the chips may form the semiconductor device.

The present invention also provides, according to its fourth aspect, a method for producing a semiconductor device, employing a first step of forming a high concentration diffusion layer of the second conduction type over a single-crystal semiconductor substrate of the first conduction type and then an epitaxial layer of the second conduction type over the diffusion layer. A second step forms a high concentration diffusion layer of the second conduction type in a scribe line area on the epitaxial layer. A third step electrochemically etches predetermined parts of the substrate with the diffusion layer in the scribe line area serving as an electrode, to leave predetermined parts of the epitaxial layer. A fourth step dices the substrate into chips along the scribe line area, so that each of the chips may form the semiconductor device.

According to the third aspect, the first step forms an epitaxial layer of the second conduction type over a single-crystal semiconductor substrate of the first conduction type. The second step forms a high concentration diffusion layer of the second conduction type in a scribe line area on the epitaxial layer as well as a high concentration diffusion layer of second conduction type in a predetermined area within each chip area on the epitaxial layer. The third step electrochemically etches predetermined parts of the substrate with the diffusion layer in the scribe line area serving as an electrode and leaves predetermined parts of the epitaxial layer. At this time, the high concentration diffusion layer of the second conduction type present in the predetermined area of the epitaxial layer within each chip area reduces horizontal resistance in the epitaxial layer, so that even parts that are distal from the voltage supply part may receive a sufficient current to promote the formation of an anode oxide film and easily stop the etching. The fourth step cuts the substrate into chips along the scribe line area, so that each of the chips forms a semiconductor device.

According to the fourth aspect, the first step forms a high concentration diffusion layer of the second conduction type over a single-crystal semiconductor substrate of the first conduction type and then an epitaxial layer of the second conduction type over the diffusion layer. The second step forms a high concentration diffusion layer of the second conduction type in a scribe line area on the epitaxial layer. The third step electrochemically etches predetermined parts of the substrate with the diffusion layer in the scribe line area serving as an electrode, to leave predetermined parts of the epitaxial layer. At this time, the high concentration diffusion layer of the second conduction type present between the substrate and the epitaxial layer reduces horizontal resistance in the epitaxial layer, so that parts that are distal from the voltage supply part may receive a sufficient current to promote the formation of an anode oxide film and easily stop the etching. The fourth step cuts the substrate into chips along the scribe line area, so that each of the chips forms a semiconductor device.

The semiconductor producing methods according to the third and fourth aspects of the present invention are basically the same as those of the methods explained with reference to FIGS. 6 to 26. The features of the third and fourth aspects will be explained with reference to FIG. 10.

A plasma nitride film (P-SiN) 52 is formed on the back of a wafer 35. The film 52 is patterned by photoetching. A current is supplied to pads formed on an aluminum film 40, to electrochemically etch the wafer 35 with an $n^+$ type diffusion layer 38 serving as an electrode. An $n^+$ type diffusion layer 39 formed in a predetermined region on an epitaxial layer 36 helps a current to sufficiently flow from the diffusion layer 38 to parts to be etched. Namely, the diffusion layer 39 reduces horizontal resistance in the epitaxial layer 36 so that even parts that are distal from the voltage supply layer may receive a sufficient current, an anode oxide film may be smoothly formed, and the etching may easily be stopped.

According to the third and fourth aspects of the present invention, the first step forms an n type epitaxial layer 36 over a p type single-crystal silicon wafer 35 (a single-crystal semiconductor substrate of the first conduction type). The second step forms an n⁺ type diffusion layer 38 (a high concentration diffusion layer of the second conduction type) in a scribe line area on the epitaxial layer 36 as well as an n⁺ type diffusion layer 39 (a high concentration diffusion layer of the second conduction type) in a predetermined area to be removed on the epitaxial layer 36 within each chip area. The third step electrochemically etches predetermined parts of the wafer 35 with the diffusion layer 38 in the scribe line area serving as an electrode, to leave predetermined parts of the epitaxial layer 36. The fourth step cuts the substrate into chips along the scribe line area, so that each of the chips forms a semiconductor device.

During the third step, the diffusion layer 39 present in the predetermined area of the epitaxial layer 36 within each chip area reduces horizontal resistance in the epitaxial layer 36, so that parts that are distal from the voltage supply layer may receive a sufficient current to promote the formation of an anode oxide film and easily stop the etching.

Since the diffusion layer 38 is disposed in the scribe line area and since the diffusion layer 39 is disposed in the through hole forming area, there is no need to expand each chip area for accommodating the layers 38 and 39.

Features of the fourth aspect of the present invention will be explained. In FIG. 30, a p⁺ type diffusion layer 48 is formed on an epitaxial layer 47 in an area where a piezoresistance layer is formed, and an n⁺ type diffusion layer 49 is formed in a scribe line area. An aluminum film 50 is formed over the diffusion layer 49.

In FIG. 31, a plasma nitride film (P-SiN) 53 is formed over the back of a wafer 45. The film 53 is patterned by photoetching. With the diffusion layer 49 in the scribe line area serving as an electrode, predetermined parts of the wafer 45 are electrochemically etched to form grooves 51, and predetermined parts of the layers 46 and 47 are left.

During the electrochemical etching, an n⁺ type diffusion layer 46 interposing between the wafer 45 and the epitaxial layer 47 helps a current to sufficiently flow from the diffusion layer 49 to the area to be etched. Namely, the layer 46 reduces the horizontal resistance of the epitaxial layer 47 acting against the current, so that even parts that are distal from the voltage supply source may receive a sufficient current, an anode oxide film may be smoothly formed, and the etching may be easily stopped.

In this way, according to the fourth aspect of the present invention, the first step forms an n⁺ type diffusion layer 46 (a high concentration diffusion layer of the second conduction type) over a p type single-crystal silicon wafer 45 (a single-crystal semiconductor substrate of the first conduction type) and then an n type epitaxial layer 47 over the diffusion layer 46. The second step forms an n⁺ type diffusion layer 49 (a high concentration diffusion layer of the second conduction type) in a scribe line area on the epitaxial layer 47. The third step electrochemically etches predetermined parts of the wafer 45 with the diffusion layer 49 in the scribe line area serving as an electrode, to leave predetermined areas of the epitaxial layer 47 and diffusion layer 46. The fourth step cuts the wafer 45 into chips along the scribe line area, so that each of the chips forms a semiconductor device.

In the third step, the diffusion layer 46 interposing between the wafer 45 and the epitaxial layer 47 helps a current to sufficiently flow from the diffusion layer 49 to the area to be etched. Namely, the layer 46 reduces horizontal resistance of the epitaxial layer 47, so that even parts that are distal from the voltage supply source may receive a sufficient current, an anode oxide film may be smoothly formed, and the etching may be easily stopped.

In any of the embodiments, the first and second conduction types may be replaced with each other.

As explained above, the third and fourth aspects of the present invention effectively reduce horizontal resistance in each chip area during electrochemical etching.

The above embodiments supply a uniform voltage to the surface of a wafer by forming an n type epitaxial layer on a p type single-crystal silicon substrate and by forming an n⁺ type diffusion layer on the epitaxial layer. The diffusion layer serves as an electrode when electrochemically etching the substrate, to leave a part of the epitaxial layer as a diaphragm.

In some cases, a high concentration diffusion layer that is irrelevant to a sensor element must be formed as an electrode for electrochemical etching. Namely, a special electrode exclusively used for etching must be prepared separately.

A fifth aspect of the present invention provides a method for producing a semiconductor device, capable of electrochemically etching a wafer with no special high concentration diffusion layer exclusively serving as an electrochemical etching electrode.

Namely, the fifth aspect of the present invention provides a method for forming a semiconductor device having a high concentration diffusion layer of the first conduction type within each chip area, including a first step of the forming an epitaxial layer of second conduction type over a single-crystal semiconductor substrate of the first conduction type. A second step forms a high concentration diffusion layer of the first conduction type in a predetermined area within each chip area on the epitaxial layer as well as a high concentration diffusion layer of the first conduction type in a scribe line area on the epitaxial layer. A third step electrochemically etches predetermined parts of the substrate with the diffusion layer in the scribe line area serving as an electrode, to leave predetermined parts of the epitaxial layer. A fourth step dices the substrate into chips along the scribe line area, so that each of the chips may form the semiconductor device.

It is preferable that the second step forms a leak preventive high concentration diffusion layer of the first conduction type on the periphery of a chip forming area on the epitaxial layer. The depth of the leak preventive layer reaches the substrate.

According to the fifth aspect, the first step forms an epitaxial layer of the second conduction type over a single-crystal semiconductor substrate of the first conduction type. The second step forms a high concentration diffusion layer of the first conduction type in a predetermined area within each chip area on the epitaxial layer as well as a high concentration diffusion layer of the first conduction type in a scribe line area on the epitaxial layer. At this time, both the high concentration diffusion layers of the first conduction type are simultaneously formed. The third step electrochemically etches predetermined parts of the substrate with the diffusion layer in the scribe line area serving as an electrode, to leave predetermined parts of the epitaxial layer. The fourth step cuts the substrate into chips along the scribe line area, so that each of the chips forms a semiconductor device.

The second step may form a leak preventive high concentration diffusion layer of the first conduction type on the periphery of the chip forming area on the epitaxial layer. The protective layer reaches the substrate and prevents a leak during the electrochemical etching.

A modification of the fifth aspect of the present invention provides a method for producing a semiconductor device having a high concentration diffusion layer within each chip area and metal electrode for the diffusion layer, including a first step of forming an epitaxial layer of the second conduction type over a single-crystal semiconductor substrate of the first conduction type. A second step forms the high concentration diffusion layer in a predetermined area within each chip area on the epitaxial layer. A third step forms the metal electrode for the high concentration diffusion layer within each chip area and fabricates a Schottky junction by directly connecting an etching metal electrode to the epitaxial layer in a scribe line area. A fourth step electrochemically etches predetermined parts of the substrate by applying a forward voltage due to the Schottky junction, to leave predetermined parts of the epitaxial layer. A fifth step dices the substrate into chips along the scribe line area, each of the chips forming the semiconductor device.

According to this modification, the first step forms an epitaxial layer of the second conduction type over a single-crystal semiconductor substrate of the first conduction type. The second step forms a high concentration diffusion layer in a predetermined area within each chip area on the epitaxial layer. The third step forms a metal electrode for the high concentration diffusion layer within each chip area and fabricates a Schottky junction by directly connecting an etching metal electrode to the epitaxial layer in a scribe line area. At this time, the metal electrode and the etching metal electrode are simultaneously formed. The fourth step electrochemically etches predetermined parts of the substrate by applying a forward voltage due to the Schottky junction, to leave predetermined parts of the epitaxial layer. The fifth step dices the substrate into chips along the scribe line area, so that each of the chips may form a semiconductor device.

An example of the method for forming a semiconductor sensor according to the fifth aspect of the present invention will be explained with reference to FIGS. 36 to 41.

In FIGS. 37–40, 42–47, and 57–59, reference CA indicates the chip area.

Figure 36:
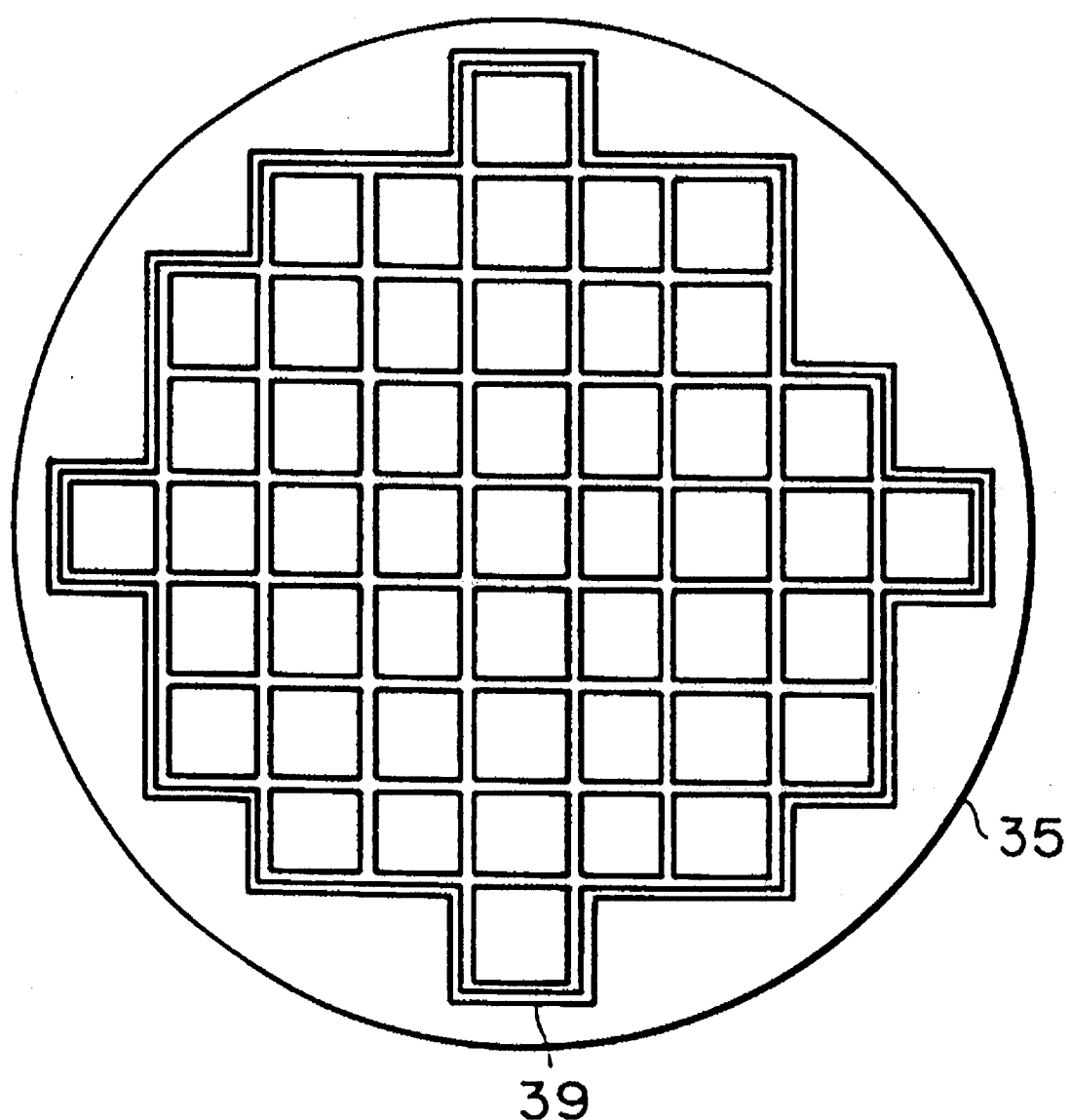
FIG. 36 is a plan view showing a wafer from which the sensors are formed.
Figure 37:
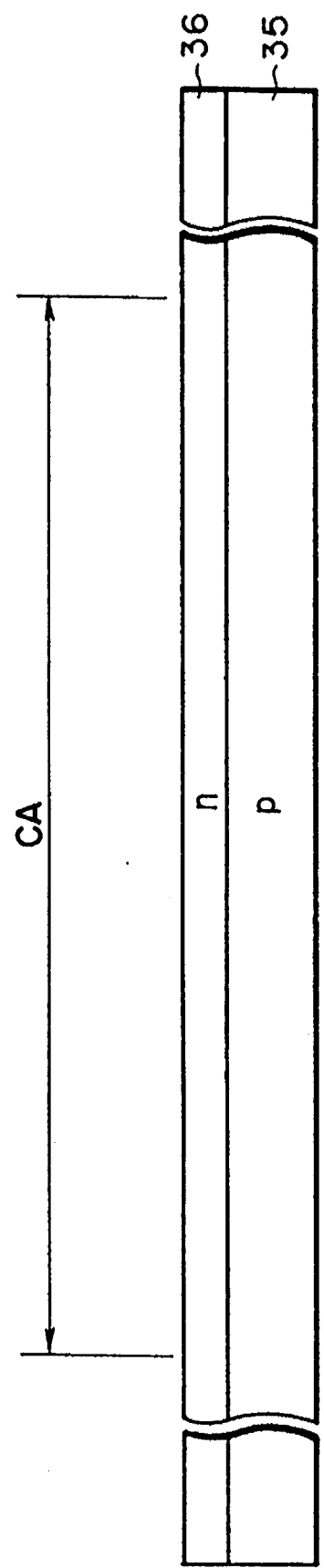
FIGS. 37 to 41 are sectional views showing steps for producing a semiconductor sensor, according to a fifth aspect of the present invention.
Figure 38:
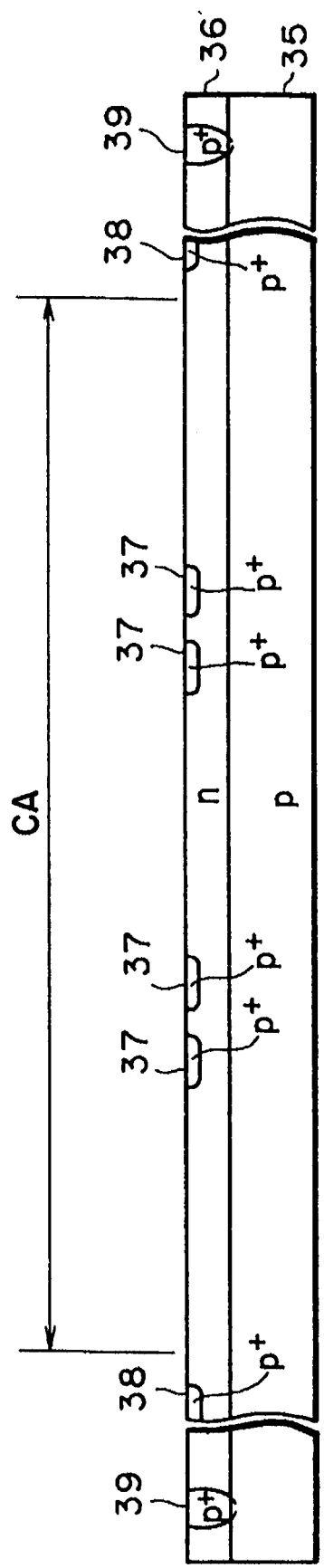

In FIG. 36, a p type single-crystal silicon wafer 35 is prepared. In FIG. 37, an n type epitaxial layer 36 is formed over the wafer 35. In FIG. 38, a $p^+$ type diffusion layer 37 is formed in a piezoresistance layer forming area on the epitaxial layer 36. A $p^+$ type diffusion layer 38 is formed in a scribe line area. A $p^+$ type diffusion layer 39 is formed on the periphery of a chip forming area on the epitaxial layer 36. The depth of the layer 39 reaches the wafer 35. These layers 37, 38, and 39 are simultaneously formed by heat treatment in an oxygen atmosphere.

Figure 39:
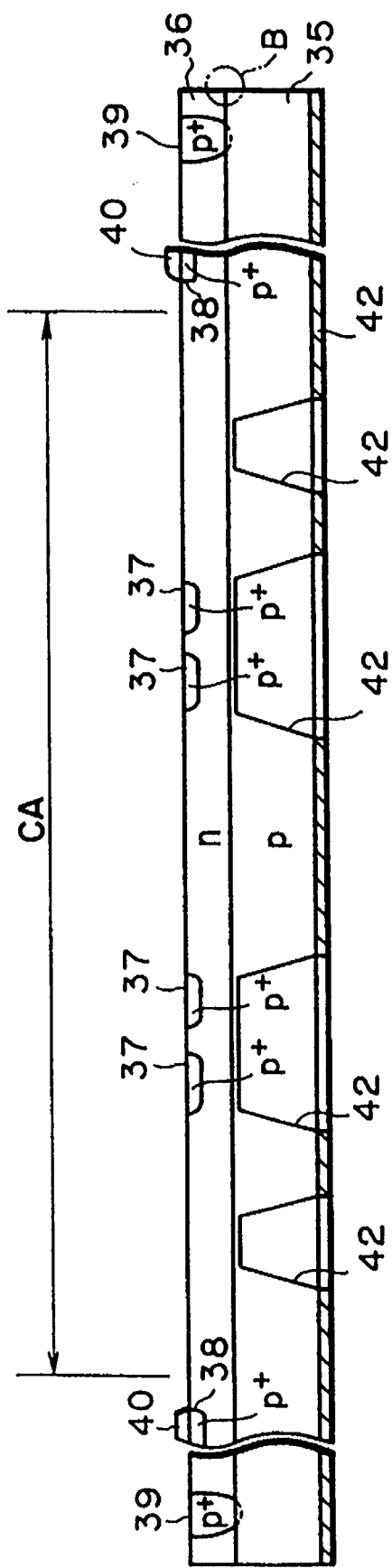

In FIG. 39, an aluminum film 40 is formed over the diffusion layer 38, and pads are disposed on parts of the aluminum film 40. A plasma nitride film (P-SiN) 41 is formed over the back of the wafer 35. The film 41 is patterned by photoetching. A current is supplied to the pads of the aluminum film 40, and with the diffusion layer 38 serving as an electrode, electrochemical etching is carried out. Namely, a positive voltage is applied to the diffusion layer 38, so that a diode structure formed between the diffusion layer 38 and the epitaxial layer 36 acts in a forward direction. As a result, a current flows from the diffusion layer 38 to the epitaxial layer 36. Namely, potential is applied to the epitaxial layer 36.

The diffusion layer 39 formed on the periphery of the chip forming area prevents a pn junction indicated with B in FIG. 39 from being inversely biased at the periphery of the wafer, i.e., from being exposed to air. This results in eliminating a leak during the electrochemical etching, and thus supplying a uniform voltage over the wafer to form a diaphragm of uniform thickness.

Predetermined parts of the wafer 35 are electrochemically etched into grooves 42. Predetermined parts of the epitaxial layer 36 remain to form movable thin beams 5, 6, 7, and 8 (FIG. 2).

In practice, the etching stops at a depletion layer extending from the pn junction toward the substrate 35. Accordingly, the semiconductor material of the substrate 35 will slightly remain on the junction between the substrate 35 and the epitaxial layer 36.

Figure 40:
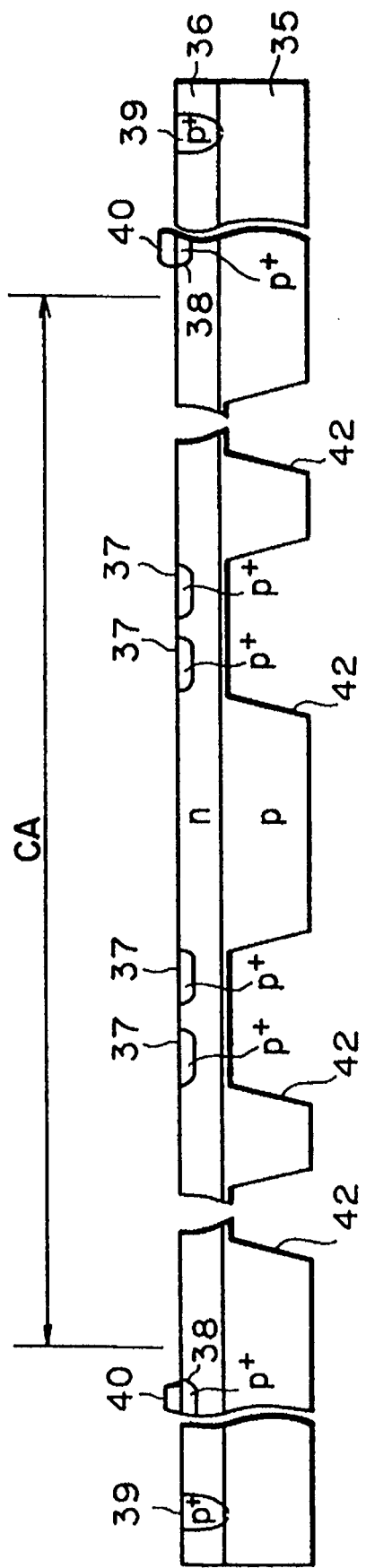
Figure 41:
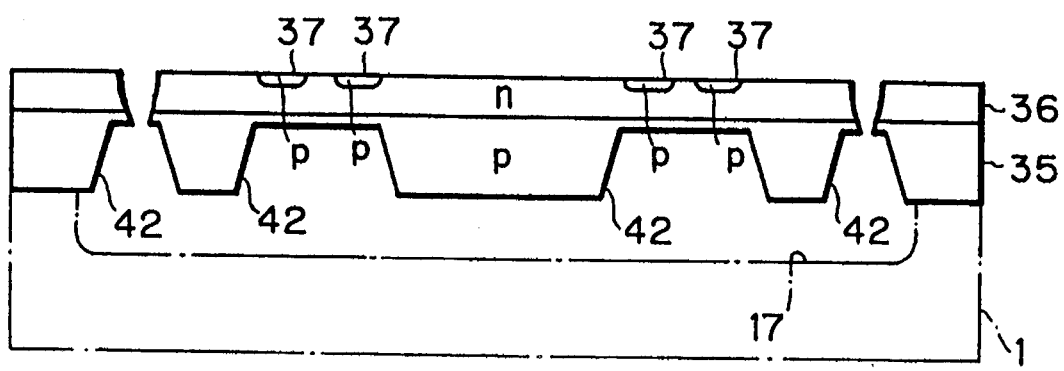

In FIG. 40, predetermined parts of the epitaxial layer 36 are removed to open the grooves 42 to form through holes 4a, 4b, 4c, 4d, and 10 (FIG. 2). The silicon wafer 35 is anodically joined with a base 1 made of Pyrex glass. The wafer 35 and base 1 are diced into chips each having predetermined dimensions along the scribe line area. FIGS. 3 and 41 show one of the chips.

In this way, according to the fifth aspect, the first step forms an n type epitaxial layer 36 over a p type single-crystal semiconductor substrate 35 (a single-crystal semiconductor substrate of the first conduction type). The second step forms a $p^+$ type diffusion layer 37 (a high concentration diffusion layer of the first conduction type) to form a piezoresistance layer in a predetermined area within each chip area on the epitaxial layer 36 as well as a $p^+$ type diffusion layer 38 (a high concentration diffusion layer of the first conduction type) in a scribe line area on the epitaxial layer 36. The third step employs the $p^+$ type diffusion layer 38 in the scribe line area as an electrode, to electrochemically etch predetermined parts of the wafer 35 and leave predetermined parts of the epitaxial layer 36. The fourth step dices the wafer into chips along the scribe line area, so that each of the chips forms a semiconductor device.

The second step simultaneously forms the diffusion layers 37 and 38. Namely, the diffusion layer 38 serving as an electrode for the electrochemical etching is simultaneously formed with the diffusion layer 37. This reduces the number of diffusion operations. Since the layer 38 is formed in the area to be cut, there is no need to increase the size of each chip area for accommodating the layer 38.

The second step may form a $p^+$ type diffusion layer 39 on the periphery of the chip forming area of the epitaxial layer 36. The depth of the layer 39 reaches the wafer 35. This layer 39 prevents a leak during the electrochemical etching. Namely, the layer 39 on the periphery of the chip forming area prevents the pn junction indicated with B in FIG. 39 from being inversely biased, i.e., from being exposed to air. This results in eliminating a leak during the electrochemical etching, supplying a uniform voltage to the whole face of the wafer, and forming a diaphragm having uniform thickness.

Although a pn junction due to the formation of the diffusion layer 39 is exposed from the surface of the epitaxial layer 36, the diffusion process (heat treatment in an oxygen atmosphere) of the diffusion layer 39 may form a silicon oxide film over the surface of the epitaxial layer 36, so that there is no pn junction that is in contact with air.

In this way, the present invention prevents fluctuations in the thickness of a diaphragm due to a leak at the pn junction during electrochemical etching, with reduced number of processes.

Figure 42:
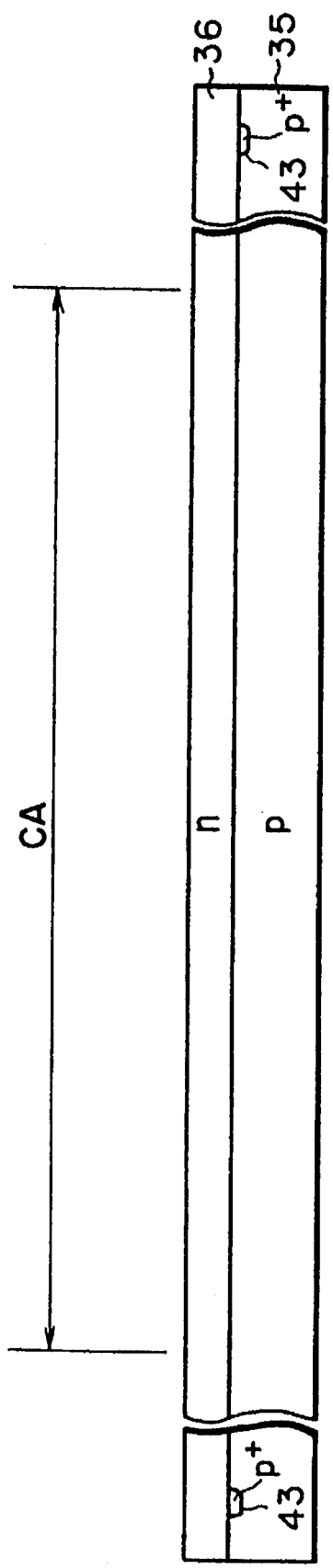
FIGS. 42 and 43 are sectional views showing steps for producing a semiconductor sensor, according to an embodiment of the fifth aspect of the present invention.
Figure 43:
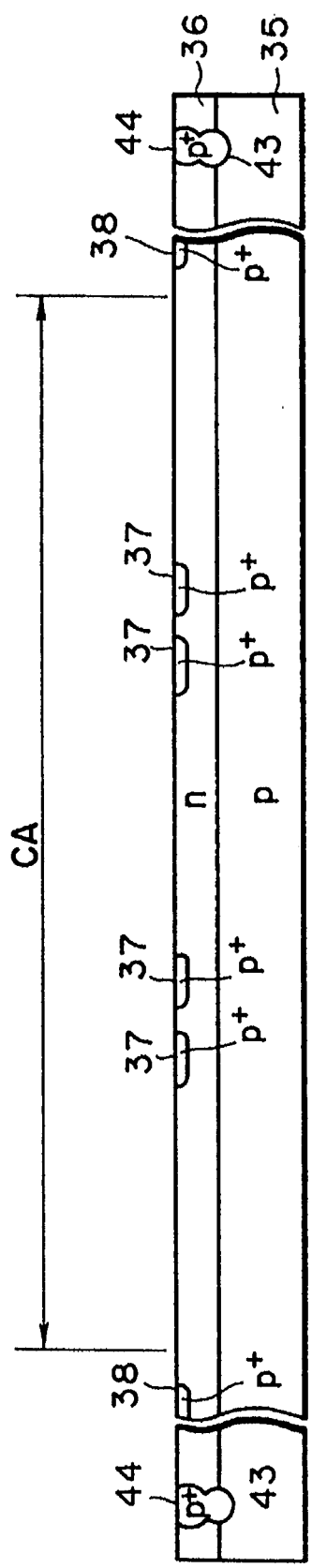

The leak preventive p⁺ type diffusion layer 39 may be formed as follows. In FIG. 42, a p⁺ type diffusion region 43 is formed on the surface of a single-crystal silicon wafer 35 in advance. In FIG. 43, a p⁺ type diffusion layer 44 is formed in an epitaxial layer 36 by heat treatment in an oxygen atmosphere. This heat treatment extends the diffusion region 43 on the wafer 35 into the epitaxial layer 36, so that the region 43 gets in contact with the diffusion layer 44.

Another embodiment according to the fifth aspect of the present invention will be explained with reference to FIGS. 44 to 48.

Figure 44:
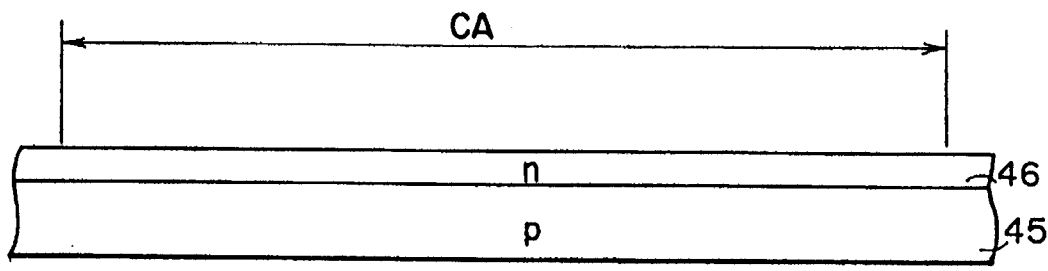
FIGS. 44 to 48 are sectional views showing steps for producing a semiconductor sensor, according to another embodiment of the fifth aspect of the present invention.

In FIG. 44, an n type epitaxial layer 46 is formed over a p type single-crystal silicon wafer (substrate) 45.

Figure 45:
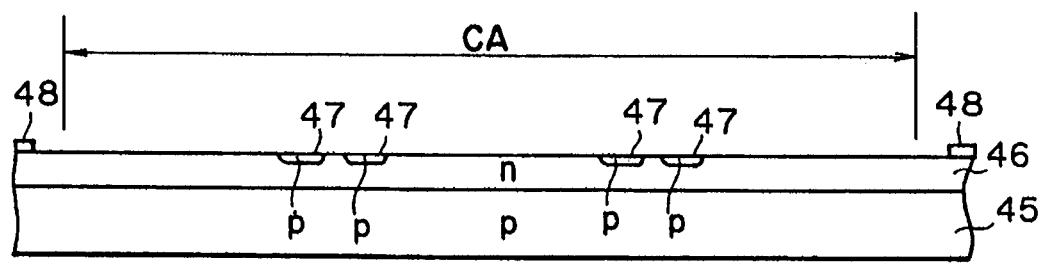

In FIG. 45, a p⁺ type diffusion layer 47 is formed in a piezoresistance layer forming area on the epitaxial layer 46. Aluminum electrode (FIG. 4) for the diffusion layer 47 is formed. An aluminum electrode 48 is formed in a scribe line area. Namely, the aluminum electrode 48 is directly attached to the epitaxial layer 46, to form a Schottky junction. Since the carrier concentration of the epitaxial layer 46 is low, the Schottky junction is formed instead of an ohmic junction. Consequently, a Schottky diode due to the Schottky junction provides a forward current.

Figure 46:
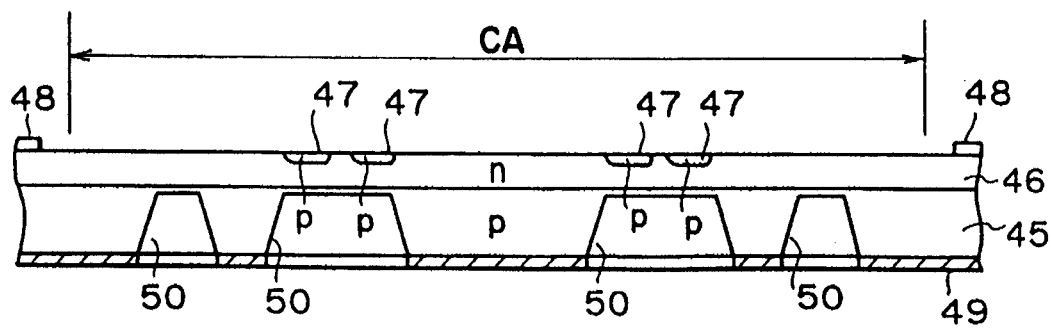

In FIG. 46, a plasma nitride film (P-SiN) 49 is formed over the back of the wafer 45, which is patterned by photoetching. With the aluminum electrode 48, an electrochemical etching is carried out. Namely, a positive voltage is applied to the aluminum electrode 48 to produce a forward voltage from the Schottky junction, to electrochemically etch predetermined parts of the wafer 45 and form grooves 50. At this time, predetermined parts of the epitaxial layer 46 are left.

Figure 47:
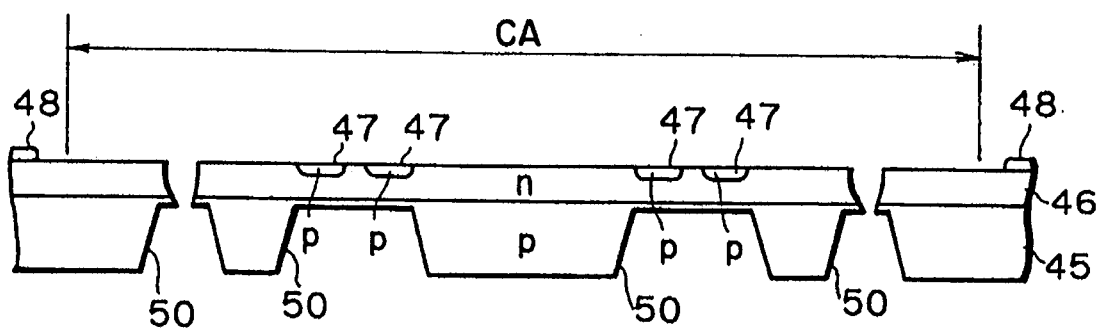
Figure 48:
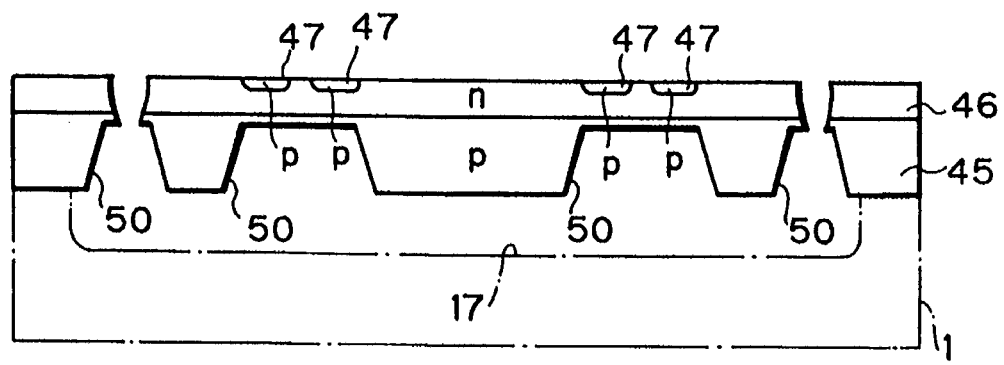

In FIG. 47, predetermined parts of the epitaxial layer 46 are removed to open the grooves 50. The silicon wafer 45 is anodically joined with a base 1 made of Pyrex glass. The wafer and base 1 are diced into chips along the scribe line area, so that each of the chips forms a semiconductor device as shown in FIG. 48.

In this way, according to this embodiment, the first step forms an n type epitaxial layer 46 over a p type single-crystal silicon wafer 45 (a single-crystal semiconductor substrate of the first conduction type). The second step forms a p⁺ type diffusion layer 47 (a high concentration diffusion layer) serving as a piezoresistance layer in a predetermined area within each chip area on the epitaxial layer 46. The third step forms an aluminum electrode for the diffusion layer 47 in each chip, and directly forms an aluminum electrode 48 (an etching metal electrode) in a scribe line area on the epitaxial layer 46, to form a Schottky junction. The fourth step electrochemically etches predetermined parts of the wafer 45 with a forward voltage of the Schottky junction through the aluminum electrode 48, to leave predetermined parts of the epitaxial layer 46. The fifth step dices the wafer 45 into chips along the scribe line area, so that each of the chips forms a semiconductor device.

The third step simultaneously forms the aluminum electrode for the diffusion layer 47 and aluminum electrode 48. Accordingly, with no additional diffusion operation, the aluminum electrode 48 is directly formed when the aluminum electrode for the diffusion layer 47 for forming strain gauges is formed.

This fifth aspect is not limited to the embodiments mentioned above. For example, the first and second conduction types in each of the embodiments may be replaced with each other.

As explained above, the fifth aspect of the present invention effectively carries out electrochemical etching with no high concentration diffusion layer serving as an exclusive electrochemical etching electrode.

A sixth aspect of the present invention will be explained. This aspect relates to a method for producing an integrated pressure sensor.

As explained before, the Japanese Unexamined Patent Publication No. 61-30039 discloses a method for electrochemically etching a wafer, to form a diaphragm of a silicon pressure sensor. This method prepares a silicon substrate formed of upper and lower layers having different conduction types. A high concentration diffusion layer serving as electrode for the electrochemical etching is formed in the inactive and scribe line areas of the silicon substrate. The lower conductive layer is electrochemically etched, and the upper conductive layer (epitaxial layer) is left, to form a diaphragm. When the high concentration diffusion layer is formed in the inactive and scribe line areas of the silicon substrate, the silicon substrate (wafer) wholly receives uniform potential. In this case, the upper conductive layer (epitaxial layer) supplies potential to parts to be etched around the diaphragm.

When this technique is applied to fabricate an integrated pressure sensor having integrated circuits on the periphery of a chip, the uniformity of a diaphragm of the chip will be deteriorated because the integrated circuits on the periphery prevent a smooth supply of potential for electrochemical etching. To solve this problem, exclusive electrode for electrochemical etching must be prepared in each chip area. This electrode, however, requires an additional space.

Accordingly, there is a need for providing a method for producing a semiconductor device, capable of fabricating a diaphragm with substantially no additional space.

To meet the requirement, the sixth aspect of the present invention provides a method for producing a semiconductor device having a thin element (a diaphragm) and an integrated circuit section with electrode on the same substrate.

The method includes a first step of forming a semiconductor layer of the second conduction type over a single-crystal semiconductor substrate of the first conduction type. A second step forms an integrated circuit section with an electrode on the semiconductor layer. A third step forms electrode in a scribe line area on the semiconductor layer and electrically connecting the electrode to the electrode of the integrated circuit section. A fourth step electrochemically etches predetermined parts of the substrate with use of the electrode in the scribe line area, to form a diaphragm from the semiconductor layer. A fifth step dices the substrate into chips along the scribe line area, each of the chips forming the semiconductor device.

Namely, the first step forms a semiconductor layer of the second conduction type over a single-crystal semiconductor substrate of the first conduction type. The second step forms an integrated circuit section with an electrode on the semiconductor layer. The third step forms an electrode in a scribe line area on the semiconductor layer and electrically connects the electrode to the electrode of the integrated circuit section. The fourth step electrochemically etches predetermined parts of the substrate with use of the electrode in the scribe line area, to form a diaphragm from the semiconductor layer. In this step, the electrode of the integrated circuit section is also used for the electrochemical etching, so that the etching may easily be stopped without using additional space, i.e., without using an exclusive electrode. The fifth step dices the substrate into chips along the scribe line area, so that each of the chips forms a semiconductor device.

A diaphragm type integrated pressure sensor formed according to the sixth aspect of the present invention will be explained.

Figure 49:
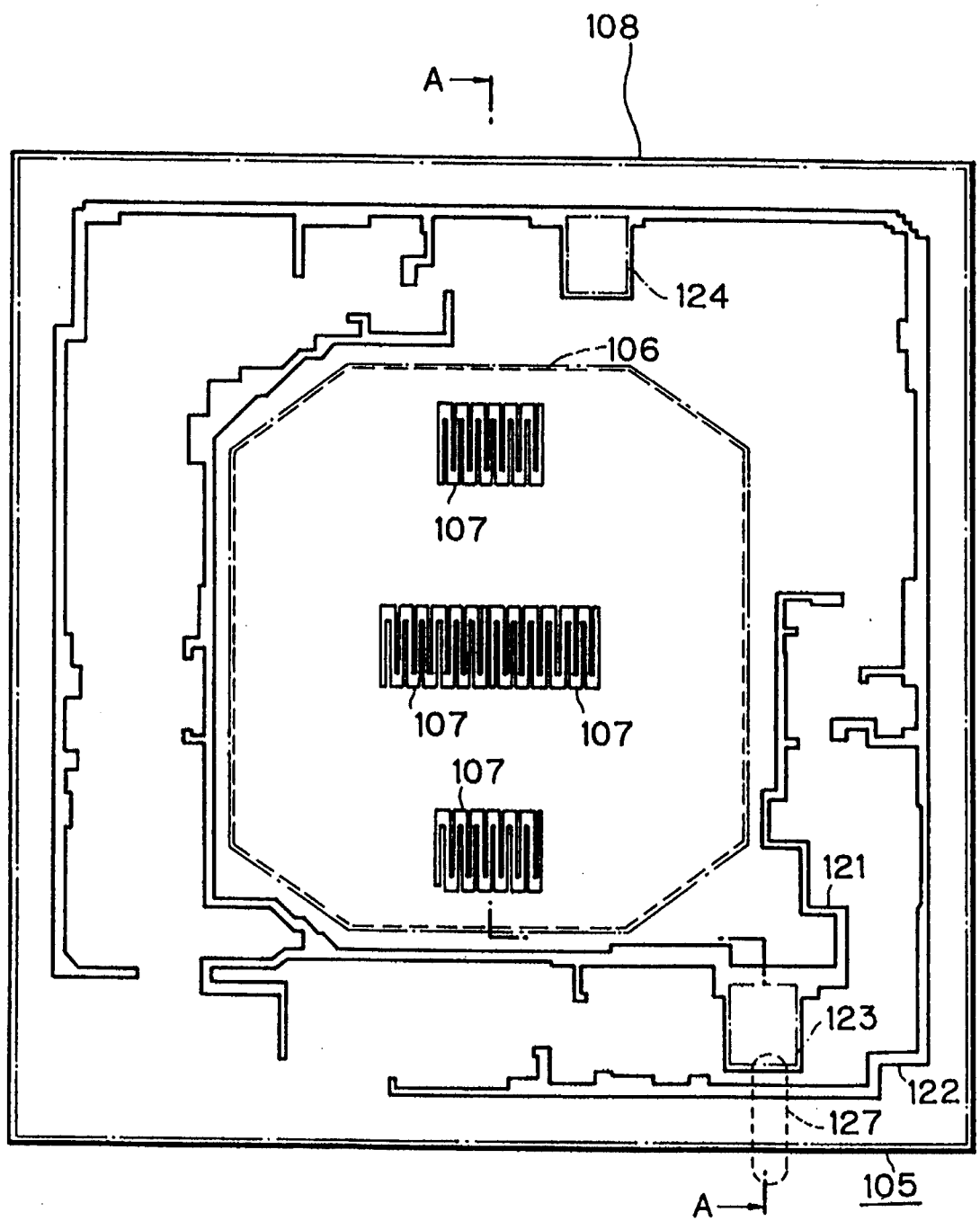
FIG. 49 is a plan view showing an integrated pressure sensor.
Figure 50:
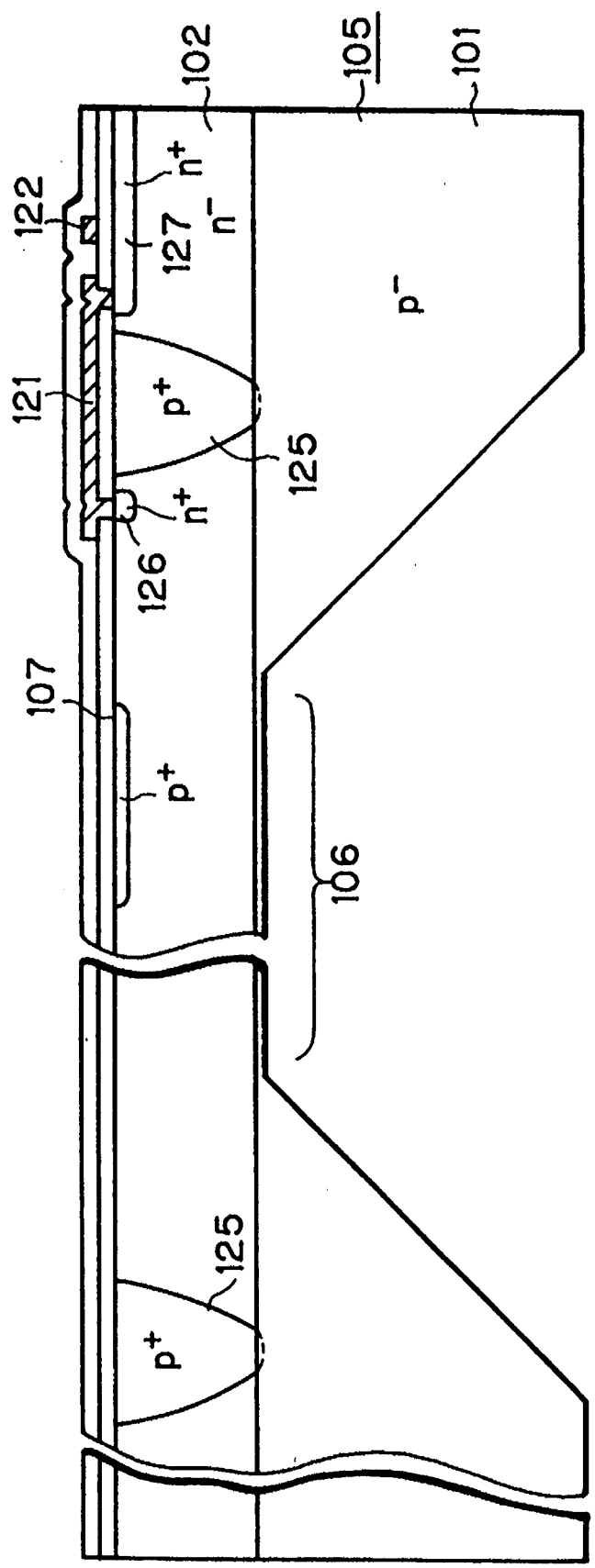
FIG. 50 is a sectional view taken along a line A—A of FIG. 49.
Figure 51:
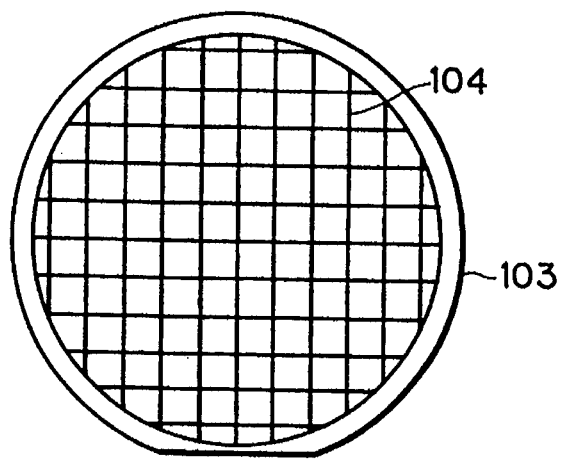
FIG. 51 is a plan view showing a semiconductor wafer from which the sensors are formed.

FIG. 49 is a plan view showing the pressure sensor chip 105. FIG. 50 is a sectional view taken along a line A—A of FIG. 49. In FIG. 50, an n⁻ type epitaxial layer 102 is laminated over a p⁻ type single-crystal silicon substrate 101. In FIG. 51, a silicon wafer 103 is diced into pressure sensor chips along a scribe line area 104.

In FIGS. 49 and 50, the silicon chip 105 has a central diaphragm 106 thinned by electrochemical etching. Four strain gauges (p⁺ type diffusion resistance layers) 107 are formed on the diaphragm 106. The strain gauges 107 are oriented in the same direction. Each of the strain gauges 107 is folded several times to increase its resistance value. The strain gauges 107 are connected to one another to form a Wheatstone bridge.

In FIG. 49, an integrated circuit section 108 is formed around the diaphragm 106 on the periphery of the chip 105. The integrated circuit section 108 amplifies an output signal of the Wheatstone bridge and processes the signal for temperature compensation, etc. The integrated circuit section 108 includes, for example, a bipolar npn transistor of FIG. 52, a base resistor of FIG. 53, a capacitor of FIG. 54, and a thin film resistor of FIG. 55.

Figure 52:
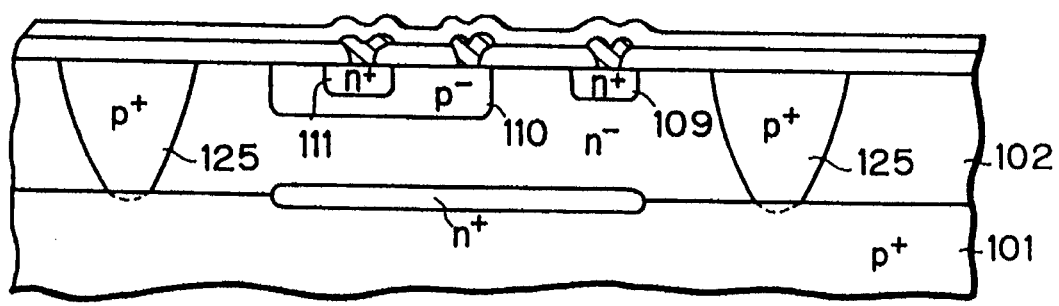
FIGS. 52 to 55 are sectional views showing different elements of the sensor.

The bipolar npn transistor of FIG. 52 has an n⁺ type collector region 109, a p⁻ type base region 110, and an n⁺ type emitter region 111. These regions are formed in the epitaxial layer 102. The base resistor of FIG. 53 has a p⁺ type base resistance region 112 connected to aluminum electrode 113. The capacitor of FIG. 54 has an SiO₂ film 114 held between an aluminum upper capacitor electrode 115 and a lower capacitor electrode (n⁺ type diffusion layer) 116. The thin film resistor of FIG. 55 has a thin film resistor 118 made of, for example, CrSi formed on an SiO₂ film 117 and connected to aluminum electrode 120 through barrier metal 119 such as TiW.

The integrated circuit section 108 is operated with a single power source. In FIG. 49, an aluminum electrode formed on the silicon chip 105 supplies potential. The integrated circuit section 108 is connected to aluminum high-potential isolation line 121 and aluminum low-potential isolation line 122. The high-potential isolation line 121 is directly connected to a power source line, and the low-potential isolation line 122 is directly connected to a ground line. Square parts 123 and 124 on the electrode patterns are bonding pads connected to Au or Al wires.

In this integrated pressure sensor (or in a standard bipolar IC), a p⁺ type isolation area 125 shown in FIGS. 50, 52, 53, and 54 is arranged to isolate elements from one another. In each chip, the aluminum low-potential isolation line 122 is connected to the area 125, to inversely bias a pn junction. A plurality of the p⁺ type base resistance areas 112 of FIG. 53 and resistances formed by the diffusion of the strain gauges 107 of FIG. 50 may be arranged in a region (called a resistance island) surrounded by the p⁺ type isolation area 125. To isolate the resistors from one another, the aluminum line 121 in the chip is connected to the resistance island. Namely, an n⁺ type diffusion layer 126 of ohmic contact is formed on the n⁻ type epitaxial layer 102 of FIG. 50, and the aluminum high-potential isolation line 121 is connected to the diffusion layer 126. Namely, the top of the diaphragm 106 forms a resistance island. Under normal operation of the device, the resistance island is isolated from the other parts by the diffusion layer 126 and aluminum high-potential isolation line 121.

Although the isolation line is directly connected to a power source or ground line, it is originally not designed for passing a current. Accordingly, the isolation line may be indirectly connected to the power source or ground line through resistors.

A method for producing such an integrated pressure sensor will be explained with reference to FIG. 56 to 59.

Figure 56:
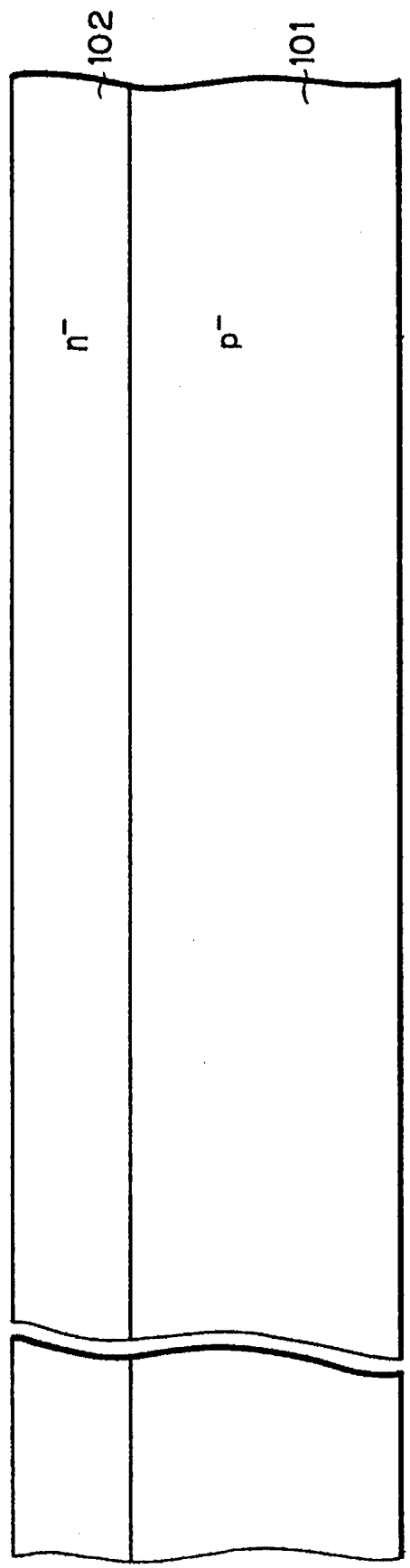
FIGS. 56 to 59 are sectional views showing steps for producing the sensor, according to the present invention.

In FIG. 56, a p⁻ type single-crystal silicon substrate (wafer) 101 is prepared. A crystal axis of the substrate has an inclination (off angle) of several degrees on a face (110) or (100). An n⁻ type epitaxial layer 102 is formed over the substrate 101.

Figure 57:
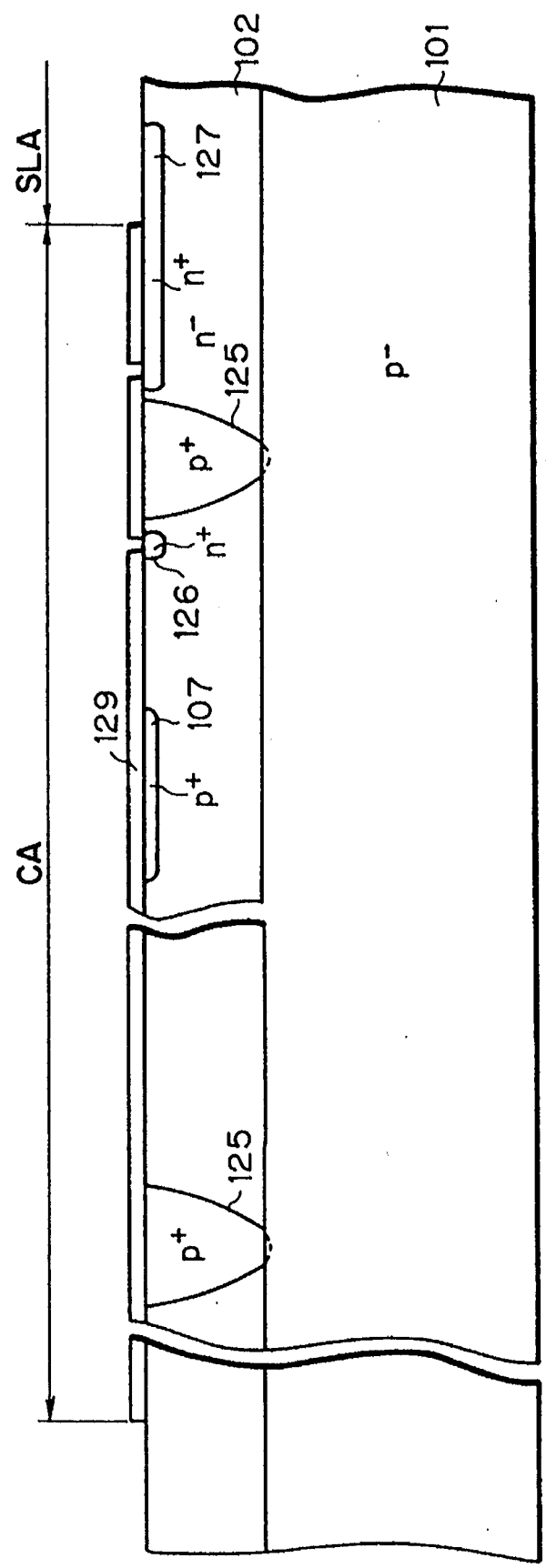

In FIG. 57, a p⁺ type isolation area 125 is formed to isolate elements from one another. A strain gauge (a p⁺ type diffusion resistance layer) 107, an n⁺ type diffusion layer 126 of ohmic contact, and an n⁺ type diffusion layer 127 for supplying electrochemical etching potential are formed. The layer 127 extends to a chip area CA and a scribe line area SLA, as shown in FIG. 49. Scribe line area SLA is also shown in FIGS. 57–59.

Figure 53:
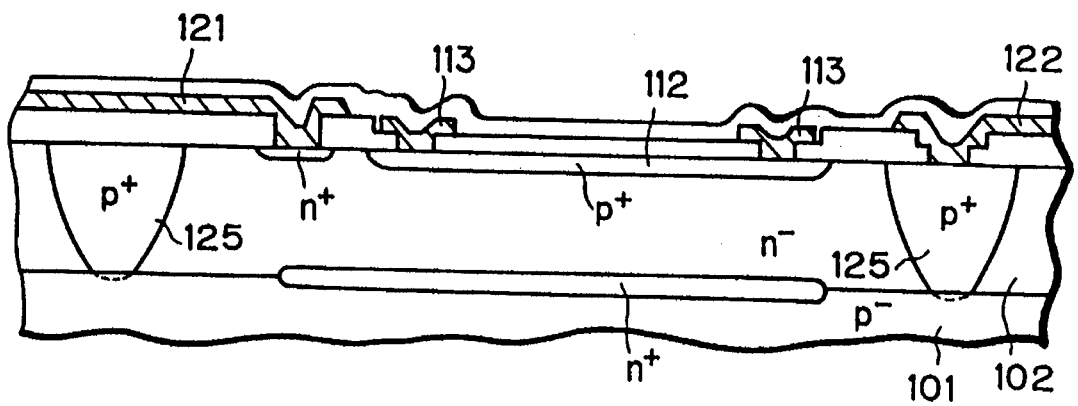
Figure 54:
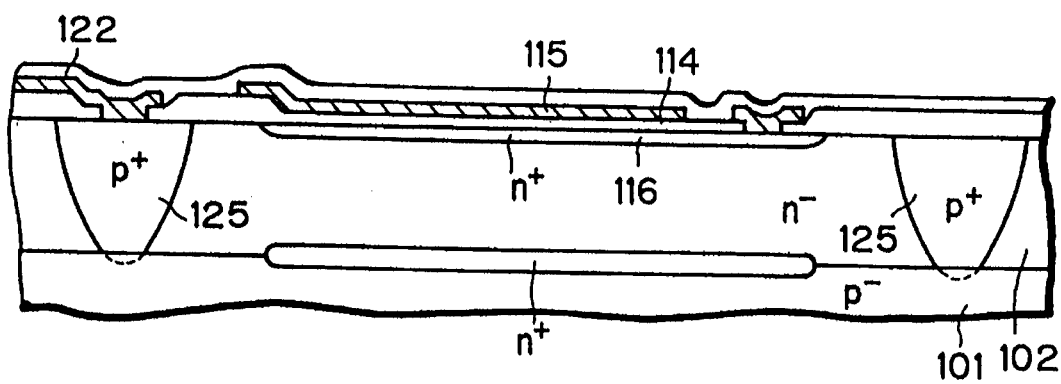
Figure 55:
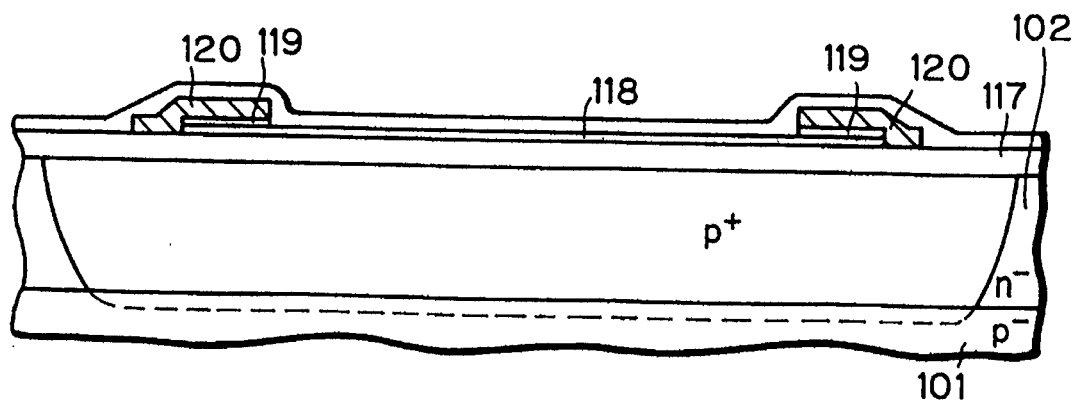

The elements of FIGS. 52 to 55 of the integrated circuit section 108 are formed on the periphery of each chip area. At this time, the base resistance region 112 of FIG. 53 is formed when the base of the transistor of FIG. 52 is formed by diffusion. The lower capacitor electrode (n⁺ type diffusion layer) 116 of FIG. 54 is formed when the emitter of the transistor is formed by diffusion. During these element forming processes, an SiO₂ layer 129 is formed over the silicon surface. The thin film resistor 118 of FIG. 55 is formed by CrSi or TiW deposition or sputtering.

Figure 58:
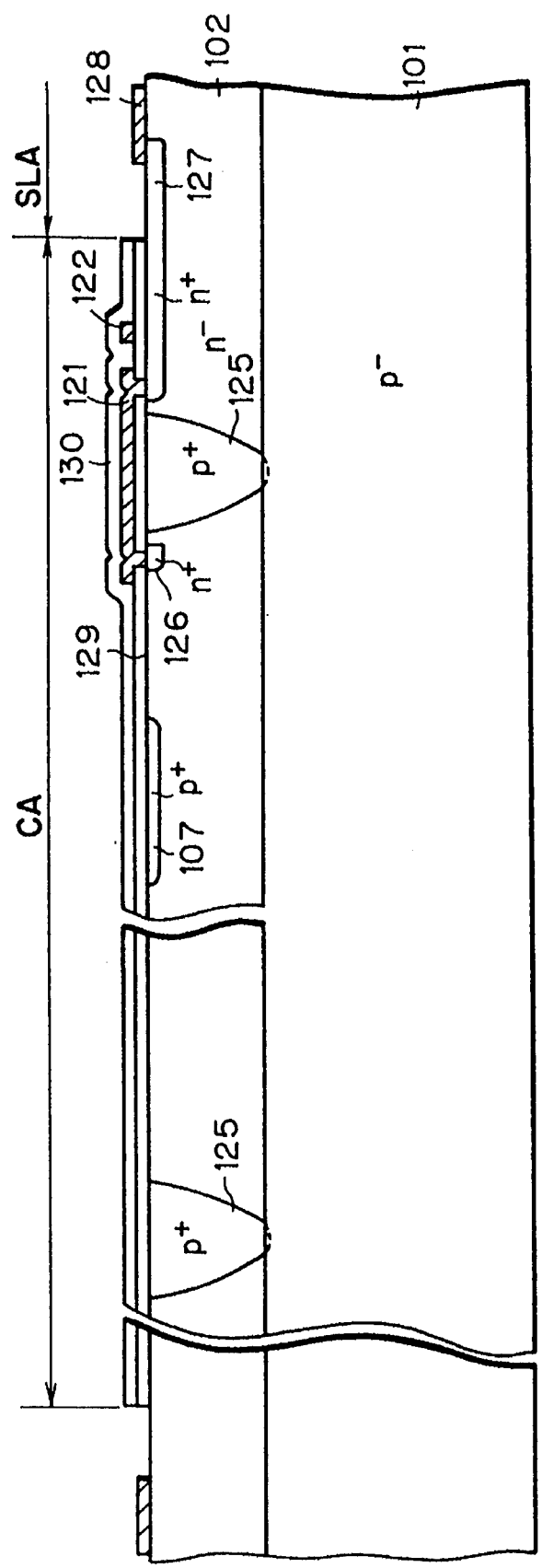
Figure 59:
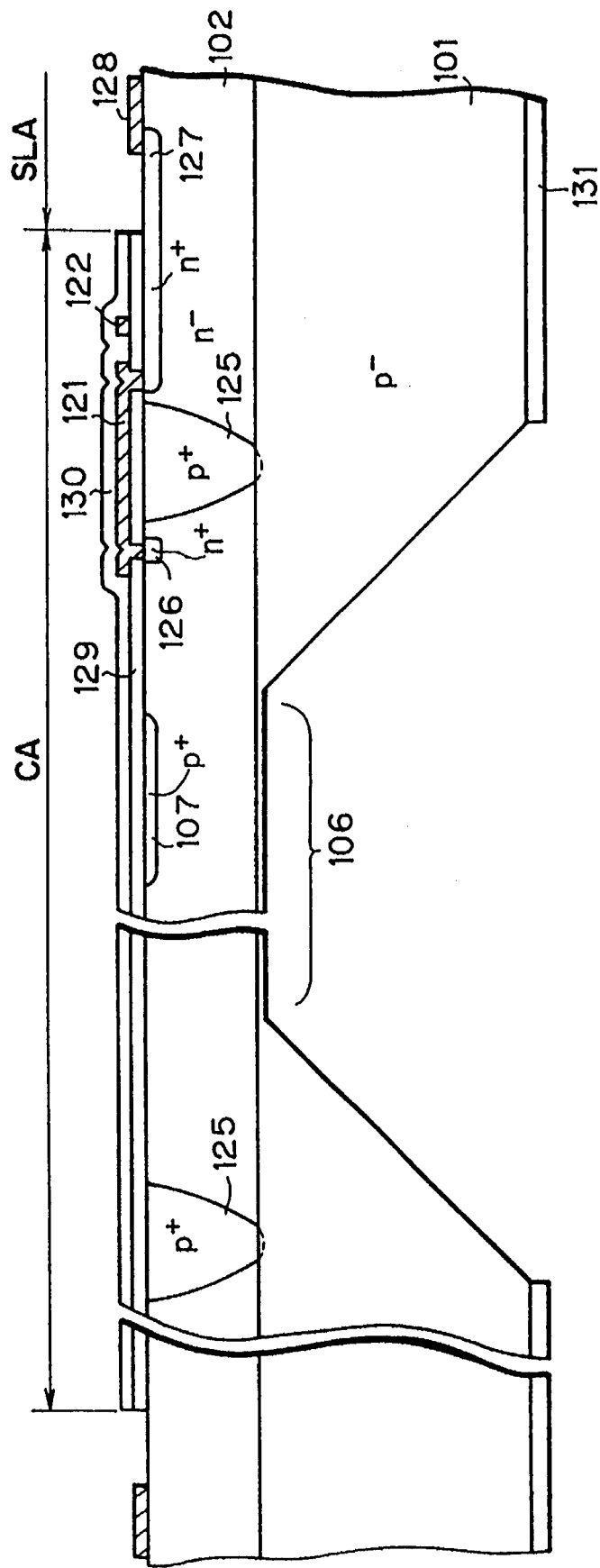

In FIG. 58, aluminum high-potential isolation line 121 and aluminum low-potential isolation line 122 are formed on the SiO₂ layer 129. At the same time, aluminum electrode 128 for supplying electrochemical etching potential in a scribe line area and other aluminum film are formed. At this time, the electrode 128 is electrically connected to the line 121 through the diffusion layer 127. Due to the electrical connection through the diffusion layer 127, the aluminum line 122 can be disposed on the diffusion layer 127.

A passivation film 130 such as an SiO₂ film and SiN_x film is formed by CVD or spattering method.

In FIG. 59, an SiN_x film 131 is formed over the back of the substrate 101, and the film 131 is patterned by photo-etching.

Predetermined parts of the substrate 101 are electrochemically etched in a solution such as a KOH aqueous solution. At this time, a voltage is applied to the aluminum electrode 128, so that the pn junction of the substrate 101 is inversely biased by the voltage through the diffusion layer 127, aluminum high-potential isolation line line 121, and diffusion layer 126. The substrate 101 is etched to about the pn junction, and the etching is stopped. The position where the etching is stopped is determined according to a depletion layer extending from the pn junction toward the substrate 101. A diaphragm 106 to be etched in each chip area receives potential through the electrode 128, which runs in a scribe line area extending in lengthwise and crosswise directions on the substrate 101, layer 127, and aluminum high-potential isolation line 121. As a result, each chip area receives uniform potential, and therefore, the etching can be stopped easily.

The thickness of the diaphragm 106 of the pressure sensor thus formed is determined by the accuracy of the epitaxial layer 102 and the width of the depletion layer. Compared with conventional diaphragm forming methods, the method of the present invention is capable of precisely controlling the thickness of the diaphragm.

In FIG. 50, the wafer is diced into chips along the scribe line area, so that each of the chips forms the integrated pressure sensor. At this time, the aluminum electrode 128 is also cut.

As explained above, according to this embodiment, the first step forms an n⁻ type epitaxial layer 102 over a p⁻ type single-crystal silicon substrate (wafer) 101. The second step forms an integrated circuit section 108 having aluminum high-potential isolation line 121 on the epitaxial layer 102. The third step forms aluminum electrode 128 for supplying electrochemical etching potential, in a scribe line area on the epitaxial layer 102, and electrically connects the electrode 128 to the aluminum line 121. The fourth step electrochemically etches predetermined parts of the substrate 101 with use of the electrode 128, to form a diaphragm (thin part) 106 from the epitaxial layer 102. The fifth step dices the wafer into chips along the scribe line area, so that each of the chips forms an integrated pressure sensor. Since the aluminum line 121 of the integrated circuit section 108 is also used for the electrochemical etching, additional exclusive wide diffusion layers and metal film for performing and stopping the etching are substantially not required.

Since the aluminum high-potential isolation line 121 is electrically connected to the electrode 128 through the diffusion layer 127, aluminum low-potential isolation line 122 can be arranged on the diffusion layer 127.

The present invention is not limited to the embodiments mentioned above. The present invention is applicable for producing, by electrochemical etching, not only integrated pressure sensors but also other semiconductor devices such as integrated acceleration sensors having an integrated circuit section.

The integrated circuit section 108 may include MOSICs instead of bipolar ICs.

Figure 60:
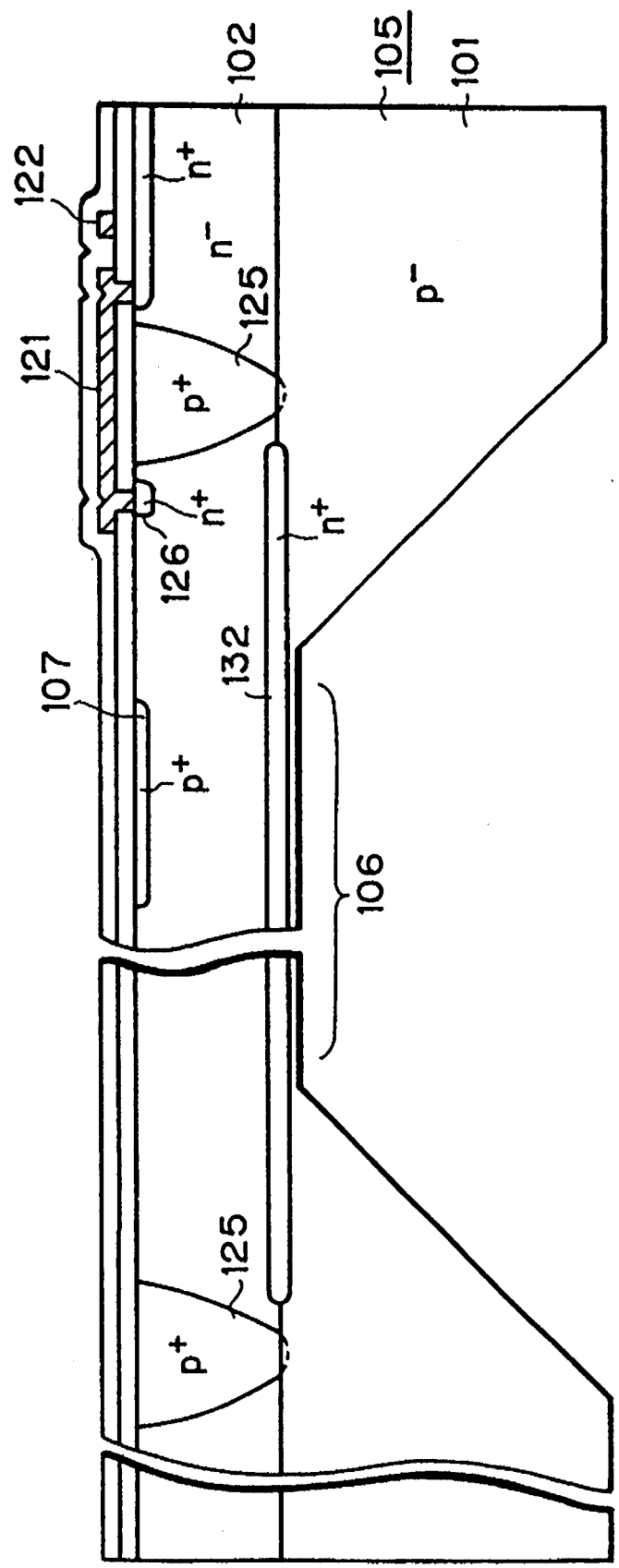
FIG. 60 is a sectional view showing another sensor produced according to the present invention.

In FIG. 60, an n⁺ type buried layer 132 is formed between a p⁻ type single-crystal silicon substrate 101 and an n⁻ type epitaxial layer 102, to form a diaphragm 106.

In the above embodiments, the first and second conduction types may be replaced with one another.

The aluminum high-potential isolation line 121 may be directly connected to the electrode 128, with no diffusion layer 127.

Instead of the epitaxial layer 102, a semiconductor layer formed by another method such as a wafer direct joint method may be used.

As explained above, the sixth aspect of the present invention is capable of forming a diaphragm (thin part) without increasing the size of each chip.

Another embodiment according to the sixth aspect of the present invention will be explained with reference to FIG. 61.

In the previous embodiment of the sixth aspect of the present invention, the n⁺ type diffusion layer 126 of ohmic contact is formed on the n⁻ type epitaxial layer 102, and the aluminum high-potential isolation line 121 is connected to the diffusion layer 126, as shown in FIG. 50.

Connecting the diffusion layer 126 to the aluminum high-potential isolation line 121 and applying high potential will cause trouble, when the impedance of the circuit 108A is small.

During electrochemical etching, the pn junction between the n⁻ type epitaxial layer 102 and the p⁻ type substrate 101 around the diaphragm must be inversely biased so that no current flows before the substrate is etched to the pn junction.

The etching process is usually stopped when a current flows through a semiconductor being etched, to form an anodic junction of the substrate.

When the impedance of the circuit 108A is small, the current may leak to the substrate 101 through the circuit 108A and isolation area 125. In this case, the etching operation may be stopped before the substrate 101 is etched to the pn junction.

To prevent the above described trouble when the impedance of the circuit 108A is small, the present embodiment connects the n⁺ type diffusion layer 126 of ohmic contact to the circuit 108A through the aluminum high-potential isolation line 121 with a leak current preventive diode DA being disposed on the way of the aluminum high-potential isolation line 121. The polarity of the diode DA is set as indicated in an integrated circuit 108 of the same chip, as shown in FIG. 61.

Namely, no current will flow from the circuit 108A to the substrate 101 through the isolation area 125 fixed at low potential.

This arrangement is particularly effective when arranging aluminum high-potential isolation line 121.

In the above arrangement, it is necessary to consider a forward voltage of the diode.

Figure 61:
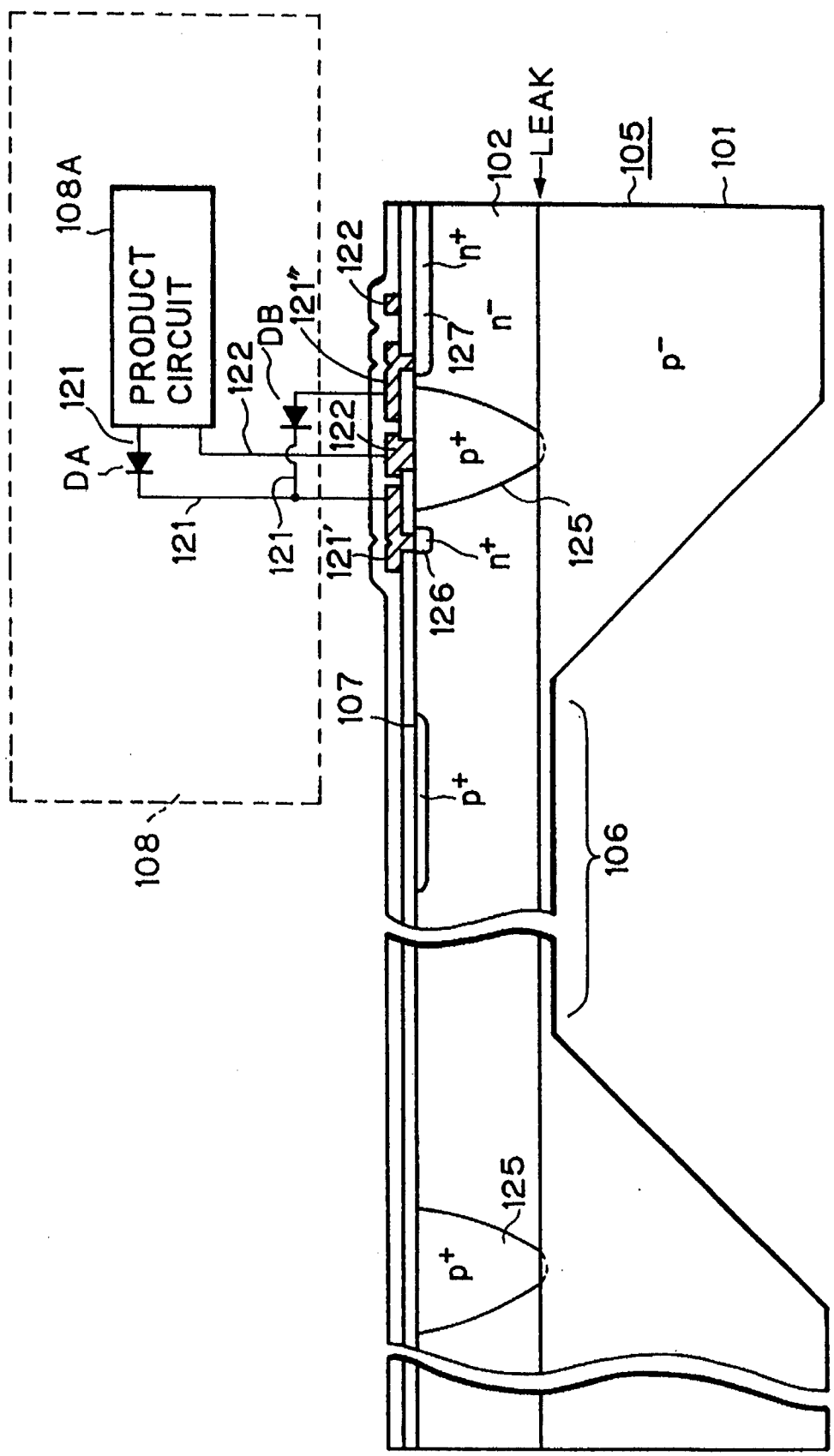
FIG. 61 is a sectional view showing still another sensor produced according to the present invention.

In FIG. 61, the aluminum high-potential isolation line 121 formed on the p⁺ type isolation area 125 is divided into two (121' and 121"). Another aluminum low-potential isolation line 122 is formed between the parts 121' and 121", and they are connected to the circuit 108A.

The leak current preventive diode DA is arranged on the way of the aluminum high-potential isolation line 121 connected to the circuit 108A.

According to this embodiment, the aluminum low-potential isolation line 122 applied low-potential is connected to the aluminum low-potential isolation electrode 122 formed on the top face of the p⁺ type isolation area 125.

According to this embodiment, it is necessary to prevent a current from flowing from each chip.

According to a prior art method, a high potential for isolation is applied to the aluminum high potential isolation line 121, so that the high potential is applied not only to the n⁺ type diffusion layer 126 of ohmic contact but also to the n⁺ type diffusion layer 127 used for electrochemical etching. But this is found to cause a problem of leak at an exposed end of the pn junction of the chip, as shown in FIG. 61.

To prevent the leakage, the present embodiment arranges a leakage current preventive diode DB of FIG. 61 having a polarity shown in FIG. 61 between the aluminum high-potential isolation line parts 121' and 121".

Figure 62:
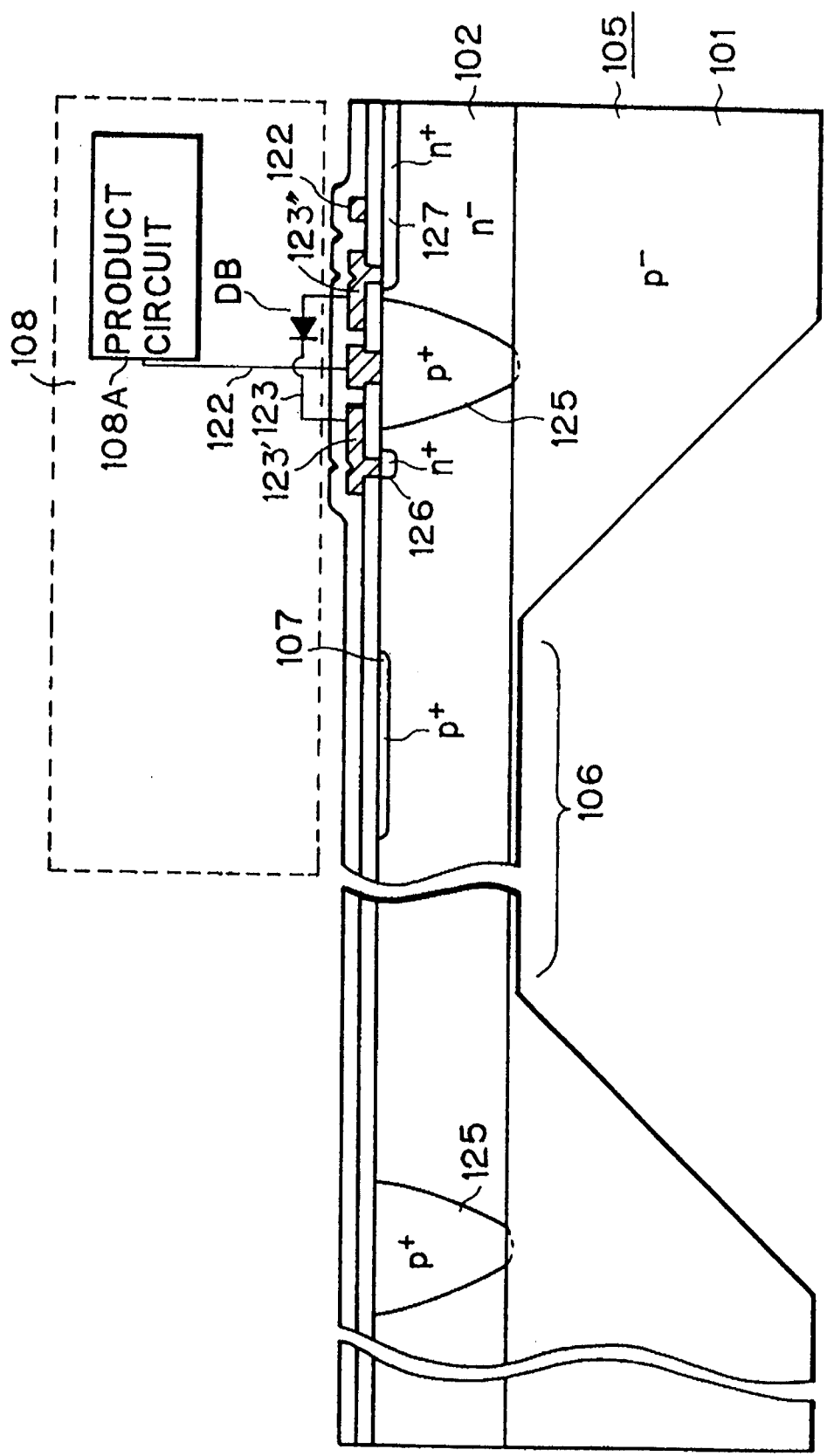
FIG. 62 is a sectional view showing still another sensor chip produced according to the present invention.

FIG. 62 shows another embodiment according to the sixth aspect of the present invention.

In this embodiment, an n⁺ type diffusion layer 126 of ohmic contact formed on an n⁻ type epitaxial layer 102 is not in contact with aluminum high-potential isolation line 121.

According to this embodiment, the aluminum line 123 is formed instead of the aluminum high-potential isolation line 121. The aluminum line 123 formed on the a p⁺ type isolation area 125 is divided into two parts (123' and 123"). Aluminum low-potential isolation line 122 is formed between the electrode parts 123' and 123". The low-potential 122 is connected to a circuit 108A. The electrode 123' is connected to the electrode 123" through a leakage current preventive diode DB. The diode DB has polarity as shown in the figure.

This embodiment supplies a voltage from a scribe line area or from an n⁺ type diffusion layer 127 used for electrochemical etching to the epitaxial layer 102 to form a diaphragm 106 without passing the electrode for the circuit 108A.

This embodiment is applicable when a plurality of resistors are not formed in a single resistance island.

When forming four strain gauges 107 of a $p^+$ type diffusion layer on the same $n^-$ type epitaxial layer 102, a high potential must be applied to the epitaxial layer 102 to isolate the strain gauges 107 from one another. When the strain gauges 107 are formed on different $n^-$ type epitaxial layers 102, respectively, it is not necessary to bias the $n^-$ type epitaxial layers to a high potential.

We claim:

1. A method for producing a semiconductor device having a thin diaphragm and an integrated circuit section with a first electrode on a same substrate, said method comprising steps of:

forming a semiconductor layer of a second conduction type over a single-crystal semiconductor substrate of a first conduction type;

forming said integrated circuit section and said first electrode on said semiconductor layer;

forming a second electrode in a scribe line area on said semiconductor layer so that said second electrode is connected electrically with said first electrode in said scribe line area through a high concentration diffusion layer formed on said semiconductor layer;

electrochemically etching a portion of said single-crystal semiconductor substrate with said second electrode in said scribe line area transmitting electricity, to form said thin diaphragm from said semiconductor layer; and dicing said single-crystal semiconductor substrate into individual ones of said semiconductor devices along said scribe line area.

2. The method according to claim 1, wherein said step of electrochemically etching removes said portion of said single-crystal semiconductor substrate.

3. The method according to claim 1, wherein said formed semiconductor layer is an epitaxial layer.

4. The method according to claim 3, wherein said step of electrochemically etching leaves a portion of said epitaxial layer.

5. The method according to claim 1, wherein in said step of electrochemically etching, said second electrode serves as an electrode for said electrochemical etching process.

6. The method according to claim 1, wherein said step of electrochemically etching comprises a step of:

applying a reverse bias voltage between said single-crystal semiconductor substrate and said semiconductor layer.

7. The method according to claim 1, wherein said step of electrochemically etching comprises a step of:

etching said semiconductor layer to a position defined by a depletion layer extending from a junction between said single-crystal semiconductor substrate and said semiconductor layer toward said semiconductor layer.

8. The method according to claim 1, comprising a further step of:

providing a buried layer between said single-crystal semiconductor substrate and said semiconductor layer.

9. The method according to claim 1, comprising a further step of:

connecting said integrated circuit section to an inside of an isolation region through a diode.

10. The method according to claim 1, wherein said second electrode is a metal thin film.

11. The method according to claim 10, wherein said second electrode includes a clearance for passing a dicing blade along said scribe line area.

12. The method according to claim 1, wherein said high concentration diffusion layer is of a second conduction type.

13. The method according to claim 12, further including a step of:

forming said high concentration diffusion layer of said second conduction type in an area on said epitaxial layer.

* * * * *